US008835981B2

United States Patent
Oishi

(10) Patent No.: US 8,835,981 B2
(45) Date of Patent: Sep. 16, 2014

(54) SOLID-STATE IMAGE SENSOR

(71) Applicant: Kabushiki Kaisha Toshiba, Tokyo (JP)

(72) Inventor: Amane Oishi, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/909,954

(22) Filed: Jun. 4, 2013

(65) Prior Publication Data

US 2014/0002700 A1 Jan. 2, 2014

(30) Foreign Application Priority Data

Jun. 29, 2012 (JP) ................................ P2012-146871

(51) Int. Cl.
| | | |
|---|---|---|
| H01L 31/0232 | (2014.01) | |
| H01L 31/028 | (2006.01) | |
| H04N 5/369 | (2011.01) | |

(52) U.S. Cl.
CPC ............ *H04N 5/369* (2013.01); *H01L 31/0232* (2013.01)
USPC .................. 257/184; 257/E27.134; 348/273; 348/294; 438/70; 438/78

(58) Field of Classification Search
CPC ............ H01L 27/1464; H01L 27/1463; H01L 27/14627; H01L 27/14689; H01L 2924/00014; H01L 27/14632; H01L 27/14643; H01L 27/14685; H01L 27/146; H01L 27/14621; H01L 27/14625; H01L 27/1461
See application file for complete search history.

(56) References Cited

U.S. PATENT DOCUMENTS

| | | | | |
|---|---|---|---|---|
| 5,691,548 | A * | 11/1997 | Akio | 257/232 |
| 7,064,405 | B2 * | 6/2006 | Kondo et al. | 257/436 |
| 7,449,359 | B2 * | 11/2008 | Seo et al. | 438/69 |
| 7,968,888 | B2 * | 6/2011 | Yamaguchi et al. | 257/72 |
| 8,274,586 | B2 * | 9/2012 | Katsuno et al. | 348/294 |
| 8,530,266 | B1 * | 9/2013 | Chen et al. | 438/73 |
| 8,610,227 | B2 * | 12/2013 | Chou et al. | 257/432 |
| 2005/0056901 | A1 * | 3/2005 | Kuriyama | 257/428 |
| 2005/0133723 | A1 * | 6/2005 | Lee et al. | 250/338.4 |
| 2006/0006485 | A1 * | 1/2006 | Mouli | 257/432 |
| 2006/0138412 | A1 * | 6/2006 | Park | 257/53 |
| 2006/0255417 | A1 * | 11/2006 | Kang | 257/432 |

(Continued)

FOREIGN PATENT DOCUMENTS

| | | |
|---|---|---|
| JP | 2008112944 | 5/2008 |
| JP | 2009-259934 | 11/2009 |
| JP | 2010109295 | 5/2010 |
| JP | 2011-108841 | 6/2011 |

*Primary Examiner* — Thomas L Dickey
*Assistant Examiner* — Joseph Schoenholtz
(74) *Attorney, Agent, or Firm* — Patterson & Sheridan, LLP

(57) ABSTRACT

According to embodiments of the present invention, a solid-state image sensor has a semiconductor element substrate having a plurality of photo electric conversion elements, an interlaminar insulating film having wires, formed at a first surface of the semiconductor element substrate, a color filter having a plurality of dye films of a plurality of colors, formed at a second surface of the semiconductor element substrate, a micro lens array having a plurality of micro lenses, formed above the color filter, a plurality of inner lenses formed between the photoelectric conversion elements and the dye films, and a shroud that surrounds each of the inner lenses, formed above the second surface of the semiconductor element substrate.

18 Claims, 15 Drawing Sheets

(56) References Cited

U.S. PATENT DOCUMENTS

| | | |
|---|---|---|
| 2009/0200625 A1* | 8/2009 | Venezia et al. ............... 257/432 |
| 2010/0062559 A1* | 3/2010 | Park et al. ...................... 438/65 |
| 2010/0110271 A1 | 5/2010 | Yanagita et al. |
| 2011/0096210 A1 | 4/2011 | Koshino et al. |
| 2011/0115948 A1* | 5/2011 | Abe et al. ................. 348/240.99 |
| 2011/0141333 A1* | 6/2011 | Naruse et al. ................. 348/308 |
| 2011/0310282 A1 | 12/2011 | Toda et al. |
| 2013/0134535 A1* | 5/2013 | Lenchenkov ................. 257/432 |

* cited by examiner

SOLID-STATE IMAGE SENSOR

CROSS-REFERENCE TO RELATED APPLICATION

This application is based upon and claims the benefit of priority from Japanese Patent Application No. 2012-146871, filed Jun. 29, 2012; the entire contents of which are incorporated herein by reference.

FIELD

Embodiments described herein relate to solid-state image sensors.

BACKGROUND

Solid-state image sensors such as CCD image sensors and CMOS image sensors are used for various applications such as digital still cameras, video cameras, and surveillance cameras. Single plate type image sensors which obtain multiple color information with a single pixel array are entering mainstream use.

In recent years, development of backside-illumination image sensors, which capture light corresponding to a photographed or imaged object at the backside of the semiconductor substrate comprising the sensor substrate are being promoted.

DETAILED DESCRIPTION

The present disclosure is directed to improve the image quality of an image formed by image sensors.

In general, embodiments of the present disclosure will be explained below with reference to the figures. In the explanations below, elements containing the same functions and/or structures will be marked with identical symbols; duplicate explanations will be given if necessary.

A solid-state image sensor in the embodiments has a semiconductor element substrate having a plurality of photo electric conversion elements, an interlaminar insulating film having wires, formed at a first surface of the semiconductor element substrate, a color filter having a plurality of dye films of a plurality of colors, formed at a second surface of the semiconductor element substrate, a micro lens array having a plurality of micro lenses, formed above the color filter, a plurality of inner lenses formed between the photoelectric conversion elements and the dye films, and a visor or shroud that surrounds each of the inner lenses, formed above the second surface of the semiconductor element substrate.

First Embodiment

A solid-state image sensor and its manufacturing method according to a first embodiment will be explained with reference to FIG. 1 through FIG. 8.

(a) Structure

A solid-state image sensor according to the first embodiment will be explained applying FIG. 1 through FIG. 5.

Figure 1:
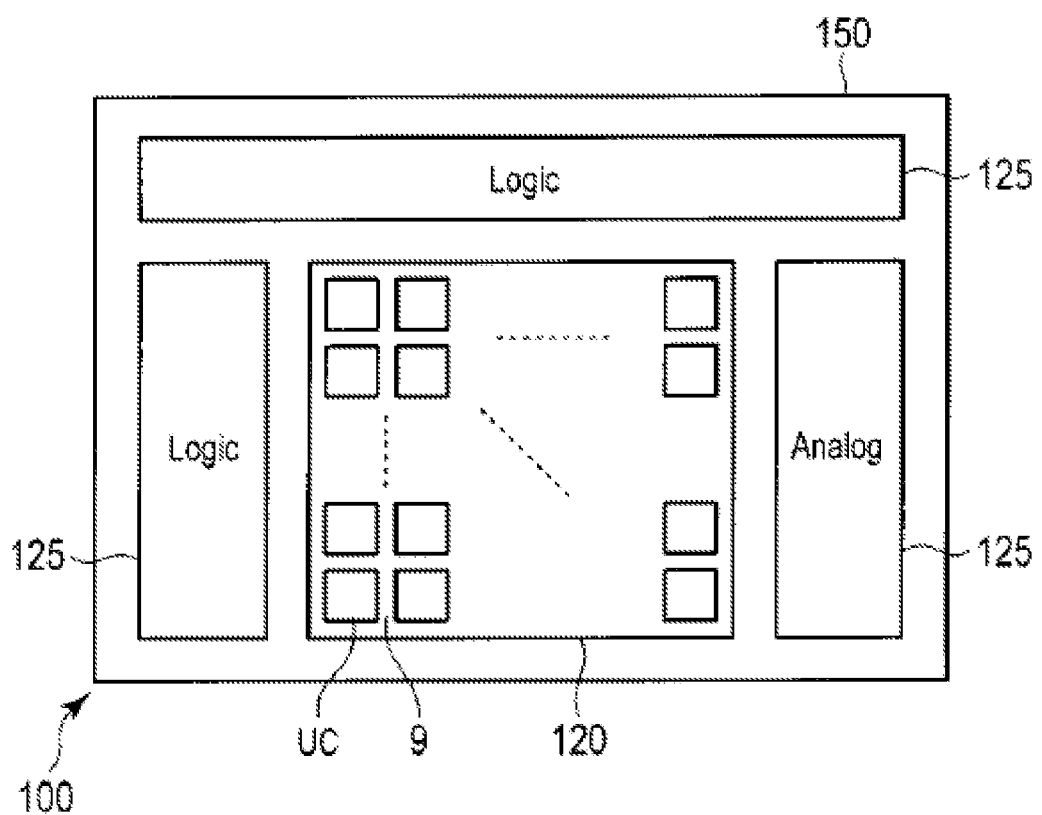
FIG. 1 is an planar view diagram showing one example of a layout of a chip in a solid-state image sensor.
Figure 2:
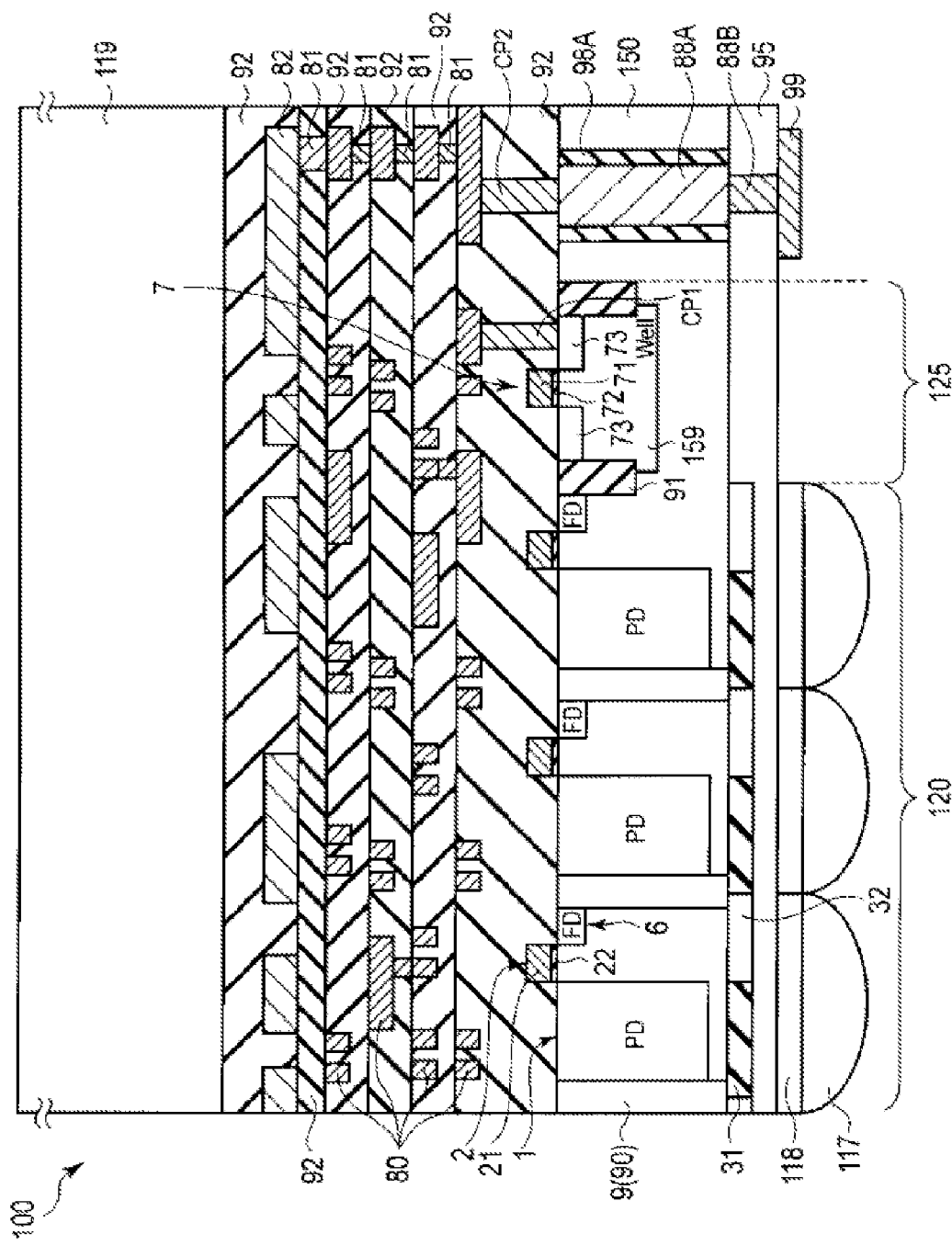
FIG. 2 is a cross-sectional diagram showing one example of a structure of the solid-state image sensor.

FIG. 1 is a schematic diagram of a layout of a chip of the solid-state image sensor (image sensor hereafter) according to the present embodiment. FIG. 2 is a cross-sectional view of a schematic structure of the image sensor.

As shown in FIG. 1 and FIG. 2, in an image sensor 100 of the present embodiment, pixel array 120 and peripheral circuit region 125, in which the analog circuit and logic circuit that control the pixel array are formed, are arranged within a single semiconductor substrate (chip) 150.

The pixel array 120 includes a plurality of unit cells UCs. The unit cells (unit cell regions) UCs are arranged within the pixel array 120 in a matrix form.

The unit cell UC includes a photoelectric convertor which converts light corresponding to photographic objects (exterior light) into electric signals. One single unit cell UC includes at least one photoelectric convertor. Pixels are formed using the photoelectric convertor.

An element isolation area (element isolating layer) 9 separates adjacent unit cells UCs as well as adjacent photoelectric convertors. Thus, a formation region of the single unit cell UC and the single photoelectric convertor is surrounded by the element isolation area 9.

The photoelectric convertor is formed from, for example, a photodiode 1. As shown in FIG. 2, the photodiode 1 is formed from at least one dopant layer within a semiconductor substrate 150. The photodiode 1 photoelectrically converts light corresponding to an imaged object into electric signals (electrical charges, voltage), which corresponds to the intensity of the light received from the imaged object. The photodiode 1 may store electrical charges generated in the dopant layer in accordance with the light received.

A floating diffusion layer or node 6, which is a dopant layer, is arranged within the semiconductor substrate 150.

The floating diffusion layer 6 functions to temporarily store charge output from the photodiode 1 through an electric field effect transistor 2.

The electric field effect transistor 2 is arranged on the semiconductor substrate 150 and in a space between the photodiode 1 and the floating diffusion layer 6. A Gate electrode 21 of the electric field effect transistor 2 is disposed above a channel region within the semiconductor substrate 150, and a gate insulating film 22 is placed between the gate electrode 21 and the semiconductor substrate 150.

The image sensor is comprised of the unit cell UC. The unit cell UC may include the other components in addition to the photodiode 1, the floating diffusion layer 6, and the transfer gate 2, depending on the circuit structure of the image sensor. For instance, the unit cell UC may include electric field effect transistors, such as an amplifier transistor and a reset transistor, as a component.

Figure 3:
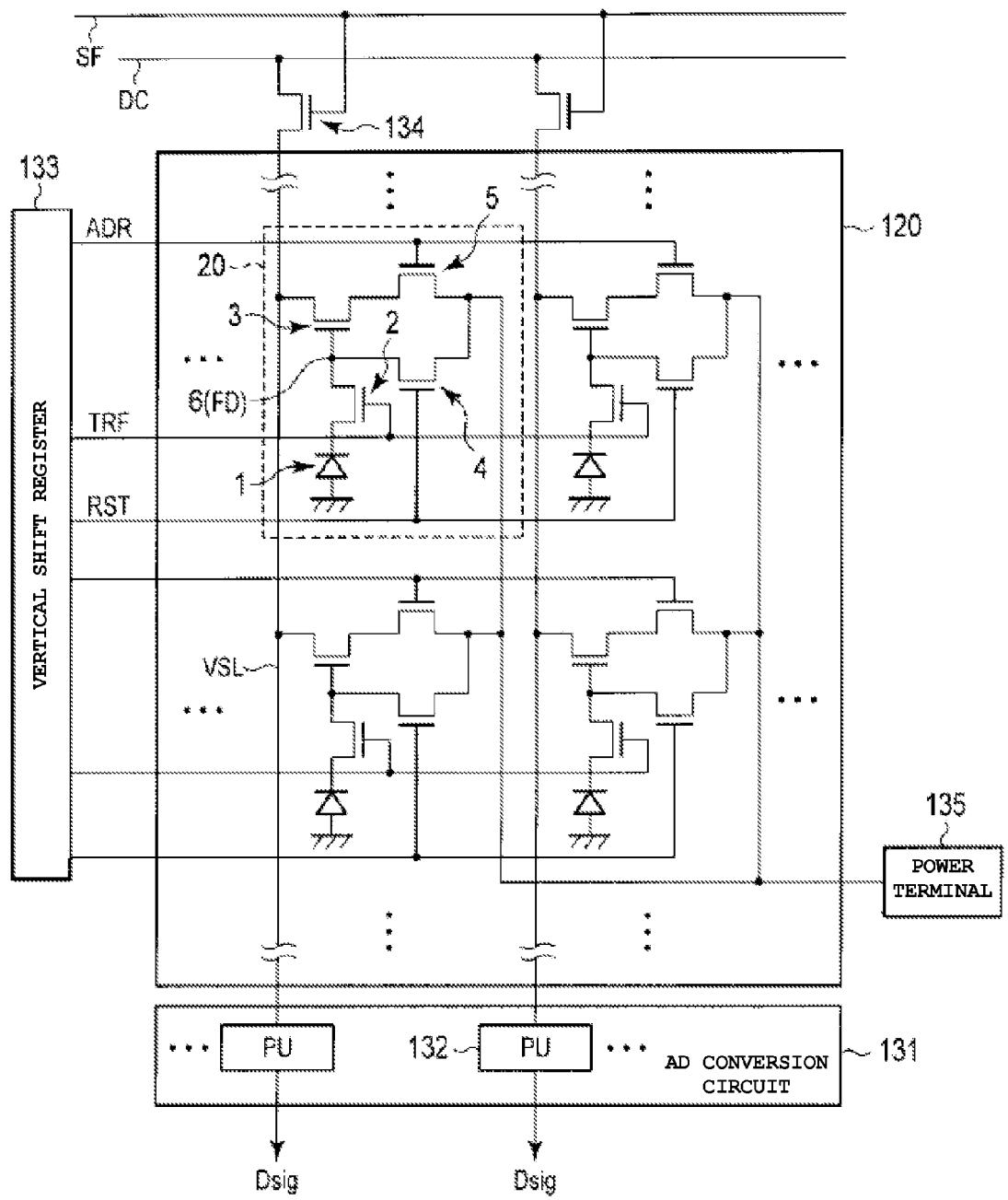
FIG. 3 is an equivalent circuit schematic showing one example of a pixel array and its neighboring circuit configuration.

FIG. 3 shows an example of a circuit structure of the pixel array 120 and its neighboring circuit.

The unit cells UCs, positioned in a matrix form within the pixel array 120, are arranged at intersections of a readout control line TRF and a vertical signal line VSL.

The unit cells UCs arranged in a row direction of the pixel array 120 are connected to the common readout control line TRF. The unit cells UCs arranged in a column direction of the pixel array 120 are connected to the common vertical signal line VSL.

For instance, a single unit cell UC includes four electric field effect transistors 2, 3, 4, 5 to control a behavior of the unit cell UC and photodiode 1. In the example shown in FIG. 3, the four electric field effect transistors 2, 3, 4, 5 included in the unit cell UC comprise a transfer gate (read transistor) 2, an amplifier transistor 3, a reset transistor 4, and an address transistor 5. The electric field transistors 2, 3, 4, 5 may be, for instance, N-channel MOS transistors.

The elements 1, 2, 3, 4, 5 within a single unit cell UC are connected as follows.

An anode of the photodiode 1 is for instance grounded. A cathode of the photodiode 1 is connected to the floating diffusion layer 6 through a current path of the transfer gate 2.

The transfer gate 2 controls storing and transferring of signal charges that are photoelectrically converted by the photodiode 1. A gate of the transfer gate 2 is connected to the readout control line TRF. One end of the current path of the transfer gate 2 is connected to the cathode of a photodiode 1, and the other end of the current path of the transfer gate 2 is connected to the floating diffusion layer 6.

The amplifier transistor 3 detects and amplifies the signal (electric potential) of the floating diffusion node 6. A gate of the amplifier transistor 3 is connected to the floating diffusion node 6. One end of the current path of the amplifier transistor 3 is connected to the vertical signal line VSL, and the other end of the current path of the amplifier transistor 3 is connected to one end of a current path of the address transistor 5. The signal amplified by the amplifier transistor 3 is output to the vertical signal line VSL. The amplifier transistor 3 functions as a source follower.

The reset transistor 4 resets an electric potential of the floating diffusion node 6, i.e., resets an amount of the signal charge stored in the floating diffusion node 6. A gate of the reset transistor 4 is connected to a reset control line RST. One end of the current path of the reset transistor 4 is connected to the floating diffusion 6, and the other end of the current path of the reset transistor 4 is connected to a power terminal 135.

The address transistor 5 controls an activation of the unit cell UC. A gate of the address transistor 5 is connected to an address control line ADR. One end of the current path of the address transistor 5 is connected to the other end of the current path of the amplifier transistor 3, and the other end of the current path of the address transistor 5 is connected to the power terminal 135.

The power terminal 135 is connected to a drain power source, ground, or a unit cell formed in an optical black region, which has a standard electric potential.

In the present embodiment, a structure in which one pixel has a single unit cell UC that contains a single photodiode 1 will be defined as a 1 Pixel-1 Cell structure.

A vertical shift register 133 is connected to the readout control line TRF, the address control line ADR, and the reset control line RST. The vertical shift register 133 controls the electric potentials of the readout control line TRF, address control line ADR, and reset control line RST and controls and selects the unit cells UC within the pixel array 120 by row. The vertical shift register 133 outputs control signals (voltage pulses) to the control lines TRF, ADR, and RST in order to control on and off of the transistors 2, 4, and 5.

An AD (analog-to-digital) conversion circuit 131 is connected to the vertical signal line VSL. The AD conversion circuit 131 includes processing unit (PUs) 132 to convert analog signals from the unit cell UC into digital signals, or to conduct a CDS (Corrected Double Sampling) processing of the signals from the unit cell UC.

A load transistor 134 is used to control a current supplied to the vertical signal line VSL. A gate of the load transistor 134 is connected to a selecting line SF. One end of the current path of the load transistor 134 is connected to one end of the current path of the amplifier transistor 3 through the vertical signal line. The other end of the current path of the load transistor 134 is connected to a control line DC.

Now, a single unit cell UC does not necessarily have the address transistor 5. If the address transistor 5 is not provided within the unit cell UC, the other end of the current path of the reset transistor 4 is connected to the other end of the current path of the amplifier transistor 3. If the unit cell UC does not have the address transistor 5, the address signal line ADR is not provided.

The unit cell UC may have a circuit structure in which two or more pixels (photodiodes) are provided, such as a 2 Pixel-1 Cell structure, a 4 Pixel-1 Cell structure, and an 8 Pixel-1 Cell structure. In the unit cell (multiple pixel-1 cell structure) containing multiple photodiodes, more than two photodiodes shares a single floating diffusion 6, a single reset transistor 3, a single amplifier transistor 4, and a single address transistor 5. In the unit cell containing multiple photodiodes, each photodiode has one transfer gate. In addition, the unit cell formed from a single pixel contains a single pixel region, the unit cell formed from a plurality of pixels contain a plurality of pixel regions. In a Multipixel-1 Cell structure unit cell, the pixel regions in a single cell are isolated by the element isolation area 9 with each other. The pixel regions are arranged within the pixel array 120.

As shown in FIG. 1 and FIG. 2, the peripheral circuit region 125 is juxtaposed to the pixel array 120 within the semiconductor substrate 150 with an element isolation area (not designated by a reference number in FIG. 1) in between.

Within the peripheral circuit region 125, circuits like the above-mentioned shift register 133 which controls the pixel array 120 and circuits like the AD conversion circuit 131 that process the signals provided from the pixel array 120 are disposed.

The peripheral circuit region 125 is electrically isolated from the pixel array 120 by the element isolation area. In order to dispose the peripheral circuit region 125 within the element isolation area, an element isolation insulating film 91 having, for example, an STI structure is embedded in the element isolation area.

The circuits within the peripheral circuit region 125 are formed from electric elements, such as an electric field effect transistor 7, resistance element, and capacitance element. In FIG. 2, to simplify the illustration, only electric field effect transistor 7 is shown. In FIG. 2, although only a single field effect transistor is illustrated, a plurality of transistors are provided on the semiconductor substrate 150 to form the peripheral circuit.

For instance, within the peripheral circuit region 125, the electric field effect transistor (e.g., MOS transistor) 7 is arranged at a well region 159 of the semiconductor substrate 150. Within the well region 159, two diffusion layers (dopant layers) 73 are provided. These two diffusion layers 73 function as a source and a drain of the transistor 7. A gate electrode 71 is provided above the surface of the well region 159 (channel region) and above a space between the two diffusion layers 73. A gate insulating film 72 is provided between the gate electrode 71 and the well region 159. Thus, the electric field effect transistor 7 is formed at the well region 159.

In addition, whether the electric field effect transistor 7 is of P-channel-type or N-channel-type will depend on the conductivity types of the well region 159, where the transistor 7 is disposed and of the diffusion layer 73, which acts as the source/drain.

A single-crystal silicon substrate (bulk substrate) or an epitaxial silicon layer of SOI substrate is used for the semiconductor substrate 150.

A plurality of interlaminar insulating films 92 are laminated on the semiconductor substrate 150 covering the gate electrodes 21 of the transistors 2, the gate electrodes 71 of the transistors 7, and the upper surfaces of the photodiodes 1. Silicon oxide is used for the interlaminar insulating films 92.

Multilayer wiring technology is used for the image sensor 100 of the present embodiment. That is, within the laminated interlaminar insulating films 92, a plurality of wirings 80 are disposed on a plurality of wiring levels (i.e., heights from the substrate surface, which is set as the standard). A single wiring 80 is electrically connected to other wiring disposed on different wiring levels by via plugs 81, which are embedded within the interlaminar insulating films 92. Also, the wirings 80 contain a dummy layer that is not connected to the components and circuits (e.g., a shading film).

The gate electrodes 21 and 71, the source/drain 73, and terminals of electric elements formed on the semiconductor substrate 150 are connected to the wirings 80 within the interlaminar insulating films 92 through contact plugs CP1 and CP2. Thus, the wirings 80 disposed on a lower layer and on an upper layer and the via plugs 81 embedded within the interlaminar insulating films 92 connect the electric elements placed on the semiconductor substrate 150. Multilayer wiring technology is used in this manner to form the circuits.

In the present embodiment, a face on which the electric elements are formed, to be more specific, a face of the semiconductor substrate 150 on which the gate electrodes 21 and 71 are disposed, is called a front surface (a first surface) of the semiconductor substrate 150. The interlaminar insulating films 92 and the wirings 80 formed by the multilayer wiring technology are disposed on the front surface of the semiconductor substrate 150. A face opposing the front surface (opposite face to the front surface) of the semiconductor substrate 150 in the perpendicular direction to the surface of semiconductor substrate 150 is called a back surface (a second surface). If the front and the back surfaces of the semiconductor substrate 150 are not distinguished, the front and the back surfaces of the semiconductor substrate 150 will be called a principal surface of the semiconductor substrate 150.

A via 88A is formed within the semiconductor substrate 150 penetrating through from the front surface to the back surface of the semiconductor substrate 150 by methods such as TSV (Through Substrate Via) technology. The via 88A is embedded in a through hole (opening) formed within the semiconductor substrate 150. An insulating layer 98A is formed on an interior surface of the through hole, and thus the via 88A is electrically isolated from the semiconductor substrate 150 by the insulating layer 98A.

The via 88A is connected to the wiring 80 within the interlaminar insulating films 92 through the contact plug CP2. The via 88A is also connected to a pad (electrode) 99 formed at the back surface of the semiconductor substrate 150 through a via plug 88B. The pad 99 is disposed on an insulating layer 95 (a flattening layer or a protective film) that is formed on the back surface of the semiconductor substrate 150. Thus the pad 99 is isolated from the semiconductor substrate 150 by an insulating layer 95.

In the present embodiment, as shown in FIG. 2, a color filter is disposed at the back surface side of the semiconductor substrate 150, overlying a protective layer (not shown) or adhesion layer (not shown) disposed therebetween. The color filter 118 is placed below, and in registration with, the pixel array 120 at the back surface of the semiconductor substrate 150. For instance, the image sensor 100 in the present embodiment is a single-plate-type image sensor. The single plate type image sensor obtains image information concerning multiple colors (wavelengths of light) from a pixel array 120. The color filter 118 contains a plurality of dye films that correspond with the colors (wavelengths).

A micro lens array 117 is disposed below the color filter 118, between which a protective layer (not shown) or an adhesion layer (not shown) is disposed. The micro lens array 117 is placed below and in registration with the pixel array 120 in the perpendicular direction to the principal surface of the semiconductor substrate 150. Specifically, the micro lens array 117 has a plurality of micro lenses that are arranged in two dimensions such that each micro lens corresponds to a single pixel (a single photodiode 1). Each micro lens concentrates the light from the photographic object onto a photodiode 1.

In the image sensor 100 of the present embodiment, the micro lens array 117 and the color filter 118 are disposed at the side of the semiconductor substrate 150 (i.e., the back surface) opposite to the side where the gate electrodes 21, 71 of transistors 2, 7 and the interlaminar insulating film are formed (i.e., the front surface). Thus, the semiconductor substrate 150, on which the electric elements are formed, is disposed between the interlaminar insulating films 92 and the micro lens array 117.

Light from imaged objects are illuminated onto the pixel array 120 from the back surface side of the semiconductor substrate 150 through the micro lens array 117 and the color filter 118 and the light entering the microlens array is then captured by the photodiodes 1.

A supporting substrate 119 is placed above the interlaminar insulating film 92. The supporting substrate 119 is disposed above the uppermost interlaminar insulating film 92, between which a protective layer (not shown) and an adhesion layer (not shown) are disposed. A silicon substrate or insulating substrate may be used for the supporting substrate 119.

In the present embodiment, a surface receiving the light from the photographic objects (an illuminated surface) is the back surface of the semiconductor substrate 150, where the micro lens array 117 is disposed. Like the image sensor 100 in the present invention, image sensors that are structured so that light from the back surface side of semiconductor substrate 150 is illuminated to the pixel 1 are called backside-illumination image sensors.

As shown in FIG. 2, the backside-illumination image sensor 100 of the present embodiment contains a plurality of inner lenses 31, which are placed between the micro lens array 117 and the photodiodes 1 in the perpendicular direction to the principal surface of the semiconductor substrate 150. A plurality of visors 32 are placed adjacent to the inner lenses 31 at the back surface of the semiconductor substrate 150.

Figure 4:
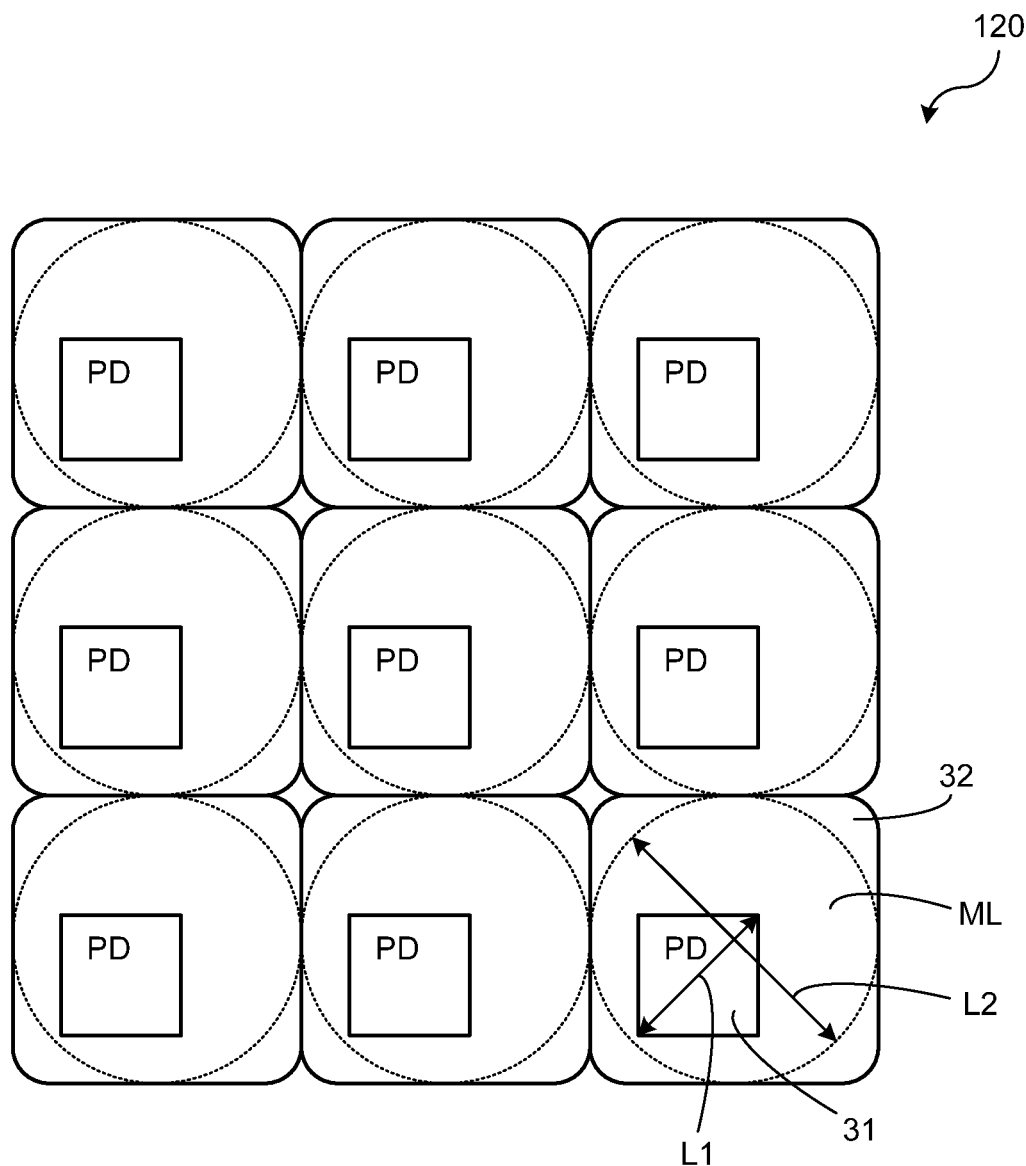
FIG. 4 is a planar view diagram showing an example of a structure of the solid-state image sensor according to a first embodiment.
Figure 5:
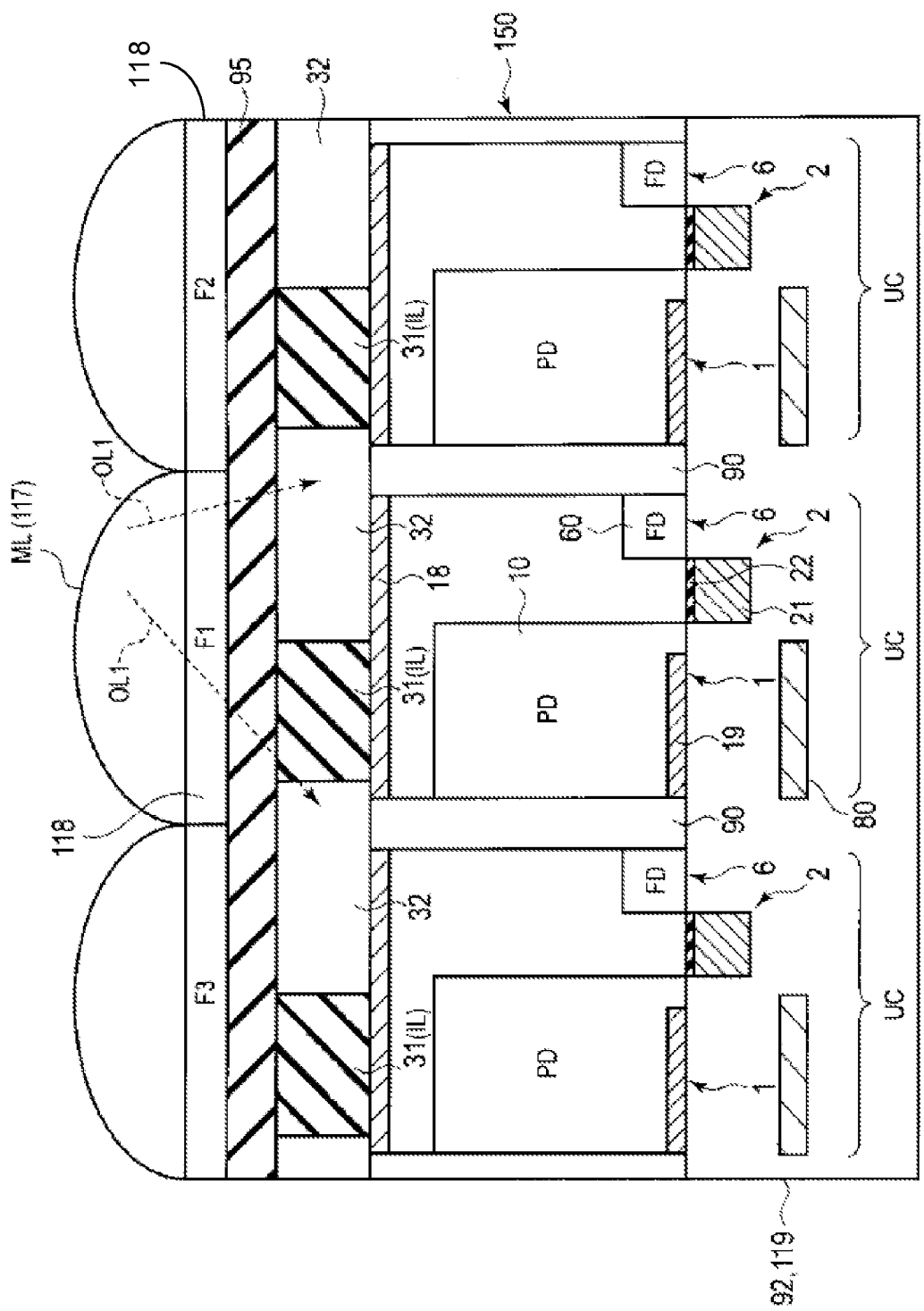
FIG. 5 is a cross-sectional diagram showing an example of a structure of the solid-state image sensor according to the first embodiment.

Using FIG. 4 and FIG. 5, the structure of the inner lenses 31 and the visors 32 of the backside-illumination image sensor 100 of the present embodiment will be explained in detail. FIG. 4 shows a planar layout of the pixel array 120 of the backside-illumination image sensor 100 of the present embodiment. FIG. 5 shows a cross-sectional structure of a 3 by 3 pixel array 120 of the backside-illumination image sensor 100 of the present embodiment, it being understood that in an actual device greater or fewer pixels may also be present.

In FIG. 5, in order to clarify the illustration, only the photodiode 1, transfer gate 2, and floating diffusion 6 are illustrated for the electric elements included in a unit cell UC. Additionally, the interlaminar insulating film, wirings, and supporting substrate at the front surface side of the semiconductor substrate 150 schematically shown as wirings 80, it being understood that the structure shown in FIG. 5 for the wirings 80 and film layers underlying (opposed to the lenses) have the structure thereof shown in FIG. 2. Also, in FIG. 5 the position of the substrate and devices are inverted in comparison to FIG. 2.

As shown in FIG. 4 and FIG. 5, the photodiode 1, the transfer gate 2, and the floating diffusion 6 are formed within an element formation region (active region), which is partitioned by an element isolation layer 90 that includes a dopant.

The photodiodes 1 are arranged in registration with the plurality of micro lenses in the perpendicular direction to the principal surface of the semiconductor substrate 150.

If the dopant layer 10 in which the photodiode 1 is formed is within a P-type semiconductor substrate (semiconductor layer) 150, dopant of the dopant layer 10 is n-type.

In FIG. 5, in order to simplify the illustration, only a single N-type dopant layer 10 is illustrated as a component of the photodiode 1. However, to improve the characteristic of the photodiode 1 (e.g., sensitivity and photoelectric conversion efficiency), a plurality of N-type and P-type dopant layers that differ in the concentration of the dopant may be laminated in the depth direction of the semiconductor substrate 150 within the formation region of the photodiode 1 (i.e., a photodiode formation region).

The floating diffusion node 6 is formed in the semiconductor substrate 150 and separated from the photodiode 1. The transfer gate 2 is formed below a space between the floating diffusion 6 and the transfer gate 2. The photodiode 1 and floating diffusion 6 node are arranged in a channel longitudinal direction of the transfer gate 2, i.e., extending inwardly and outwardly of the view of the device in FIG. 5.

The floating diffusion 6 node is an N-type dopant layer formed within the semiconductor substrate 150. For instance, the concentration of the N-type dopant in the N-type dopant layer 60 is greater than the concentration of the N-type dopant in the N-type dopant layer 10.

The transfer gate 2 is located on the semiconductor substrate 150 intermediate of the location of the photodiode 1 and the floating diffusion 6 node in the substrate 150. The gate electrode 21 of the transfer gate 2 is formed below the semiconductor substrate 150, between which the gate insulating film 22 is formed. The N-type dopant layer 10 and the N-type dopant layer 60 forming the floating diffusion node 6 function as a source and a drain of the transfer gate 2. The semiconductor substrate region located between the two N-type dopant layers 10 and 60 within the semiconductor substrate 150 constitutes a channel region of the transfer gate 2.

At the front surface of the semiconductor substrate 150, a front surface shield layer 19 is formed within the N-type dopant layer 10. The front surface shield layer 19 is, for example, a P-type dopant layer. The front surface shield layer 19 is formed so as to be isolated from the channel region of the transfer gate 132. The upper surface (the lower side in FIG. 5) of the front surface shield layer 19 is in contact with the interlaminar insulating film 92.

A back surface shield layer 18 is formed within the semiconductor substrate 150, at the back surface of the semiconductor substrate 150. The Back surface shield layer 18 may be in contact with the N-type dopant layer 10. The Back surface shield layer 18 is, for example, a P-type dopant layer.

A dark current generated on the photodiode 1 may be controlled by the back surface and the front surface shield layers 18, 19.

As shown in FIG. 4 and FIG. 5, inner lenses 31 are disposed between the micro lens array 117 and the photodiodes 1 at the back surface of the semiconductor substrate 150. The inner lenses 31 are formed from transparent materials. For instance, the inner lenses 31 are formed from silicon oxides ($SiO_2$), silicon nitrides ($Si_3N_4$), silicon oxynitrides, or organic materials. The inner lenses 31 are arranged at the back surface of the semiconductor substrate 150 in a matrix form, and each inner lens 31 corresponds to a single photodiode 1. The inner lens 31 provides an optical waveguide from the micro lens ML to the photodiode 1. In FIG. 5 the surface of the inner lens 31 on the side of the micro lens ML is flat. However, the surface of the inner lens 31 on the side of the micro lens ML may be a curved surface (spherical surface) as well.

For instance, with respect to the dimension in the parallel direction to the principal surface of the semiconductor substrate 150, a maximum size L1 of the inner lens 31 is smaller than a maximum size L2 of the micro lens ML.

The visors or shrouds 32 are formed so as to surround the inner lenses 31 in the parallel direction to the principal surface of the semiconductor substrate 150. Thus the shrouds are formed between the adjacent inner lenses 31 arranged in the parallel direction to the principal surface of the semiconductor substrate 150. Thus, the shrouds 32 are adjacent to the inner lenses 31. In the perpendicular direction to the principal surface of the semiconductor substrate 150, the height or thickness of the shrouds 32 at the side of the micro lens shroud is same as the height or thickness of the inner lenses 31 extending from the adjacent surface of the semiconductor substrate 150 at the side of the micro lens.

The shrouds 32 in the present embodiment are formed from materials that have a property of absorbing or reflecting light (e.g., visible light). However, the shrouds 32 and inner lenses 31 are arranged, with respect to the photodiodes 1, such that the light receiving surface of the photodiodes 1 at the back surface of the semiconductor substrate 150 are not covered by the shrouds 32 and are thus exposed to light passing through the micro lens array 117 through the inner lenses 31.

The shrouds 32 are positioned to overlie and thus block, from light entering the microlens array 117, the element isolation layer 90, transfer gate 2, and floating diffusion node 6 in the perpendicular direction to the principal surface of the semiconductor substrate 150. Thus, the shroud 32 covers the element isolation layer 90, transfer gate 2, and floating diffusion 6 at the back surface of the semiconductor substrate 150. In addition, the shrouds 32 may cover the edge of the photodiodes 1 in the parallel direction to the principal surface of the semiconductor substrate 150. In terms of the planar shape of each shroud 32, the corners may be rounded or chamfered.

The color filter 118 having discrete and different wavelength absorbing and transmitting properties among individual filter elements F1, F2 and F3 thereof, is disposed to overlie the insulating film 95 which overlies the inner lenses 31 and the shrouds 32 at the back surface side of the semiconductor substrate 150.

In a single-plate-type image sensor, the color filter 118 includes a plurality of adjacent film layers F1, F2, and F3 with different color admitting and transmitting properties. The color filter 118 may include, for example, red, blue, and green dye films, wherein each of the dye films F1, F2 and F3 are configured to allow only light of a specific wavelength or range of wavelengths, corresponding to a color, therethrough, so that each pixel in the pixel array receives a specific wavelength range of light and thus the color rendering properties of the imaging device may be precise. The dye films F1, F2, and F3 are arranged within the color filter 118 so that a single color dye film corresponds to a single unit cell UC and a single photodiode 1. These dye films F1, F2, F3 are arranged within the color filter 118 so that they form a layout of Bayer pattern. Now, in addition to red, green, and blue; the color filter 118 may contain yellow or white filters.

In two adjacent photodiodes (pixel regions), the color filtering, i.e., the wavelengths of light which may pass through each of the films F1 to F3, of the dye films F1, F2, and F3 disposed on the corresponding photodiodes differ from each other.

In the micro lens array 117, the micro lenses ML are arranged above and in registration with the dye films F1, F2, F3.

In the image sensor 100 of the present embodiment, the shroud 32 in a unit cell UC, i.e., entering a single photodiode 1, absorbs or blocks the light entering the other unit cells. Due to this, light from a unit cell (photodiode) is does not enter the inside of another unit cell (photodiode).

In the image sensor 100 of the present embodiment, the shroud 32 (or referred to as an absorbing layer below) is composed of one or more semiconductors. The shroud 32 is formed from materials having an absorption coefficient higher than that of Si. For instance, it is desirable that materials of the shroud 32 have little or no transparency, and absorbs and/or reflects incident light thereon. In addition, it is desirable that the refractive indices of the inner lens 31 and shrouds 32 differ. Due to the difference in the refractive indices of the inner lens 31 and shroud 32, the light that enters from inner lens 31 to the shroud 32 is reflected at the interface of the inner lens 31 and shroud 32, and then enters the photodiode 1 that corresponds to the inner lens 31. As a result, the function of the inner lens 31, as a waveguide for the light from the photographic objects to the unit cell UC (within pixel), is improved.

The shroud 32, for example, is formed from SiGe (Silicon Germanium). The light absorption coefficient of a SiGe shroud is larger than the absorption coefficient of adjacent silicon with respect to a visible light. A SiGe layer employed as the shroud 32, may be a pure semiconductor layer that includes little or no dopant or may be a semiconductor layer that includes N-type or P-type dopants (i.e., a conductive semiconductor layer).

Furthermore, the shroud 32 may be comprised of another semiconductor material than SiGe as long as the material has the property of absorbing and/or reflecting light. For example, the shroud 32 may be formed from Si. However, to improve the light blocking effect from the adjacent unit cells UC (between pixels), it is desirable that the material for the shroud 32 is chosen from materials with high absorption coefficient, for example materials that have larger absorption coefficient than Si, such as SiGe. Alternatively, a metallic compound that has the characteristic of absorbing and/or reflecting visible light may also be used for the shroud 32.

In an image sensor without the shroud 32, light OL1 that passes through the dye film F1 that corresponds to a unit cell may enter (leak into) the adjacent unit cells, depending on the incident angle of the light to the image sensor. When the unintended light from adjacent unit cells is photoelectrically converted by the photodiode of the unit cell, an optical crosstalk may occur, resulting in a mixture of colors in the formed images.

Furthermore, as the densification of pixel array and miniaturization of the unit cell (pixel) progresses, the space between unit cells and pixels becomes smaller. As a result, the impact of optical crosstalk becomes more significant.

In the image sensor 100 of the present embodiment, the shroud 32, which is comprised of SiGe, absorbs the OL1 light that enters the shroud 32 from adjacent unit cells.

Thus, almost all the light OL 1 that would otherwise cause crosstalk between the adjacent unit cells (referred to as leaked light, below) are absorbed by the shroud 32. Hence, even if the light OL1 in a direction s from a unit cell (one of the pixels) to the photodiode 1 in the adjacent unit cell (the other pixel), the photodiode 1 in the adjacent unit cell will barely receive the light OL1 from the unit cell because of the blocking action of the shroud 32.

Therefore, the light that passed the color filter and heads from a unit cell to the adjacent unit cell is rarely photoelectrically converted by the photodiode 1 of the adjacent unit cell.

In the present embodiment, the undesirable effect of the optical crosstalk in the image sensor is decreased and the mixture of colors in the images formed is controlled in this manner.

Accordingly the image sensor of the present embodiment can improve the accuracy of the images received.

(b) Manufacturing Method

A manufacturing method of a solid-state imaging device (for example, an image sensor) of the first embodiment will be explained using FIG. 6 through FIG. 8.

Figure 6:
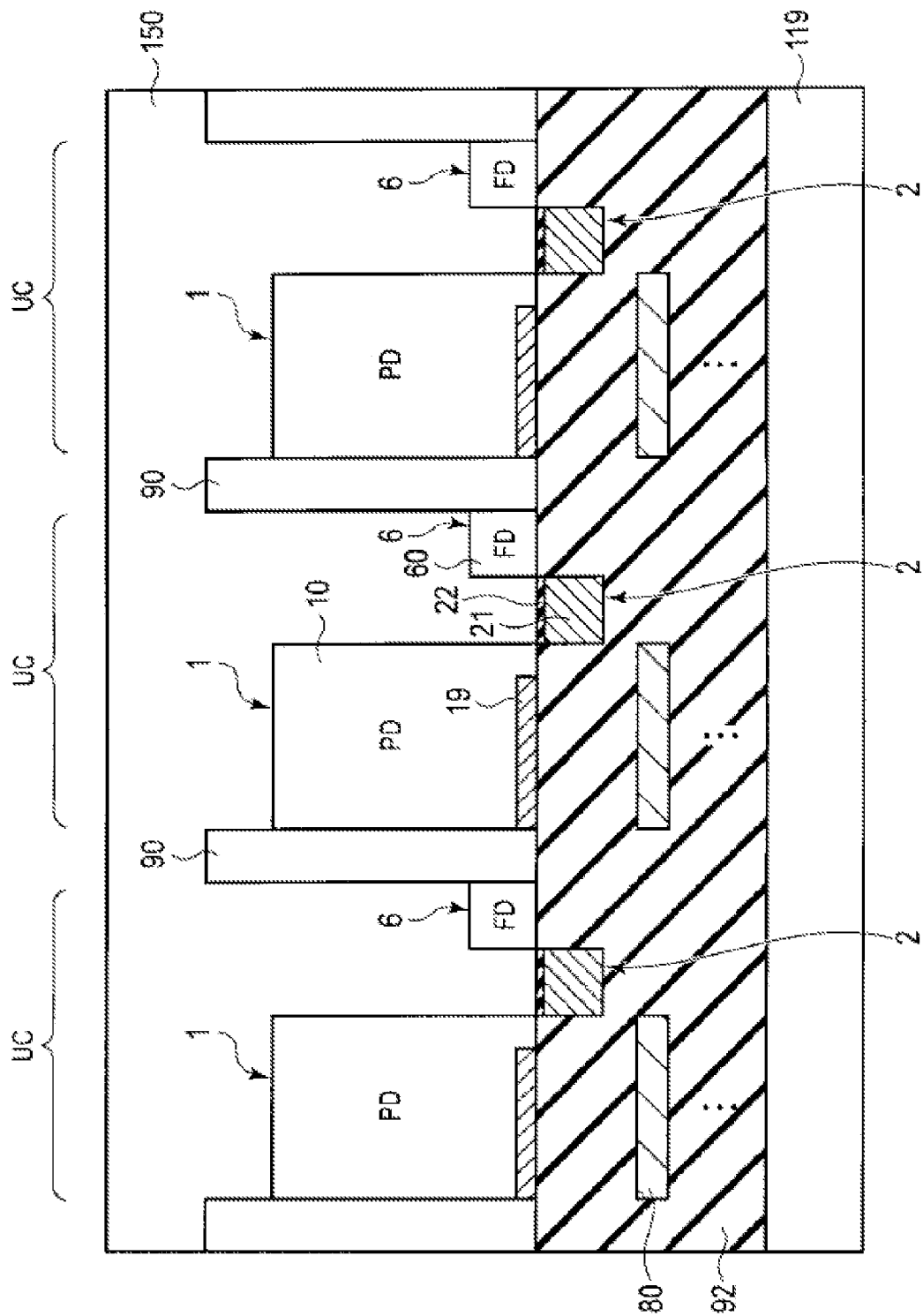
FIG. 6 explains a process of a manufacturing method of the solid-state image sensor according to the first embodiment.
Figure 7:
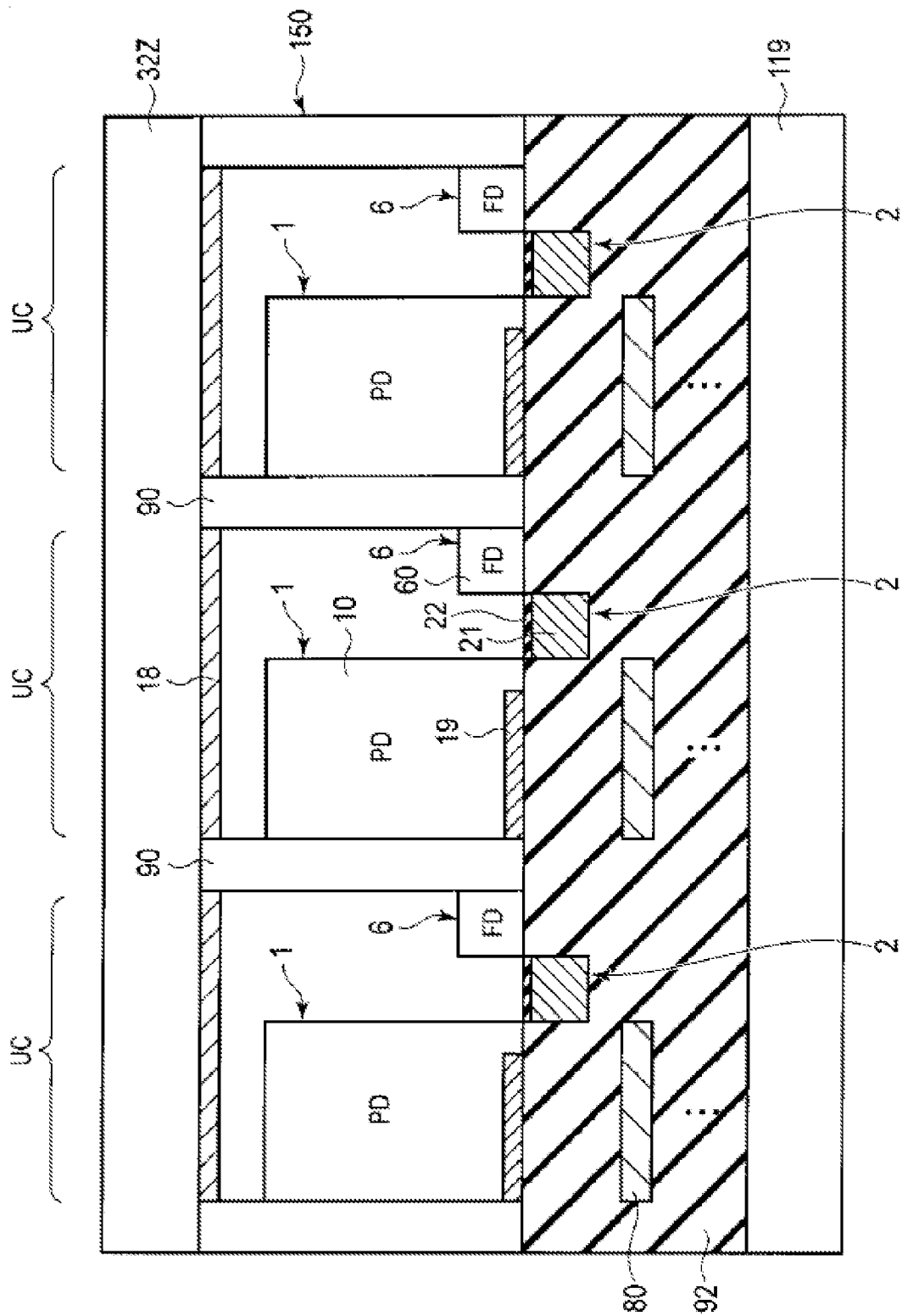
FIG. 7 explains a process of the manufacturing process of the solid-state image sensor according to the first embodiment.
Figure 8:
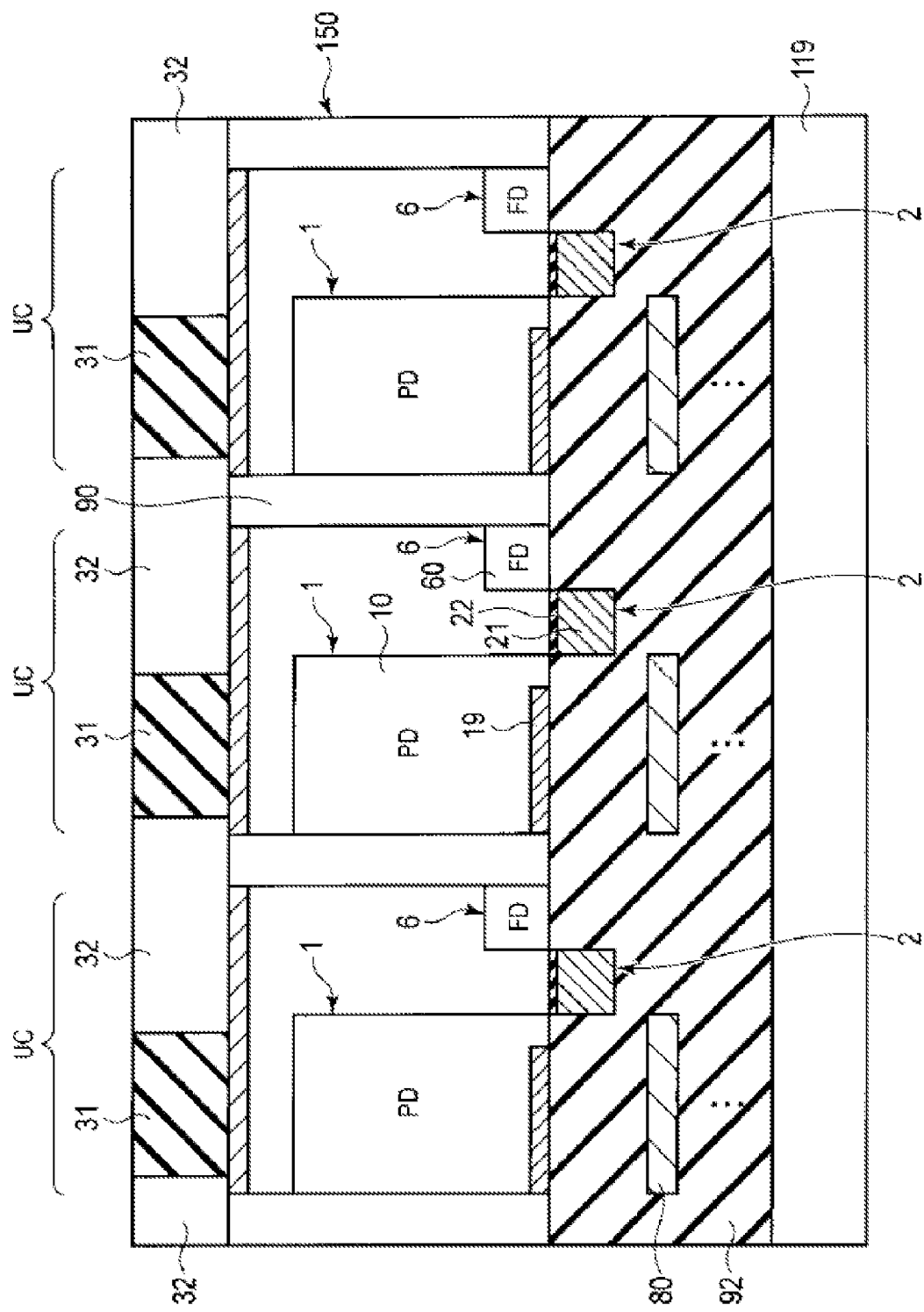
FIG. 8 explains a process of the manufacturing process of the solid-state image sensor according to the first embodiment.

FIGS. 6 through 8, respectively, show a cross-sectional view of the pixel array 120 in a process of the image sensor manufacturing method of this embodiment. Here, we will use FIG. 2 and FIG. 5 to explain each processes of the image sensor manufacturing method of this embodiment, in addition to FIG. 6 through FIG. 8. Furthermore, within the image sensor manufacturing method of this embodiment, the forming sequence of the components, which will be mentioned below, may be changed as long as the consistencies of the processes are secured.

As shown in FIG. 6, the element isolating layer 90 is formed within the substrate 150, at a position so as to surround the region within which the photoelectric diode 1, the floating node 6 and the channel region therebetween are to be formed, using standard masking (photolithographic) techniques to form a masking layer and patter the same.

For example, through ion implantation, the element isolation layer 90 made of doped semiconductor layer will be formed at specified regions of the semiconductor substrate 150 (for example, within the pixel array 120), which are exposed through apertures in the mask.

As shown in FIG. 2, the device isolation groove to form a STI (Shallow Trench Isolation) structure 91 therein is formed within the semiconductor substrate 150 using a mask and reactive ion etching the groove through apertures in the mask, and filling the groove with an by a CVD (Chemical Vapor Deposition) method or a spin coating method. By this process, the STI film 91 forming the STI structure is formed on a specified region in the semiconductor substrate 150.

As result of this process, the unit cell region UC within of pixel array 120 and the neighboring circuit region 125 are partitioned from one another in the semiconductor substrate 150.

Using a different mask from the one that is used to form the element isolation layer, N-type or P-type well region is formed in a specified region in the semiconductor substrate 150.

As are shown in FIG. 2 and FIG. 6, the electric elements that are included in the image sensor are formed in the unit cell region UC of the pixel array 120 and in the neighboring well region 159 of the circuit region 125.

The gate insulating film 22 of the transistor 2 and the gate insulating film 72 of the transistor 7 are formed on the exposed surfaces (front surface) of the semiconductor substrate 150 by conducting a thermal oxidation process to the semiconductor substrate 150. On the formed gate insulating films 22 and 72, a polysilicon layer is deposited by a CVD method. Then, by using photolithography to form a patterned mask and the RIE method, the polysilicon layer is patterned and the gate electrodes 21 and 71 that have specified gate lengths and gate widths are formed on the gate insulating films 22, and 72.

As shown in FIG. 6, in the pixel array 120 area, by using the gate electrode 22 and a patterned resist film (not shown) used as a mask, the n-type dopant layer 10 of photodiode 1 is formed at the photodiode formation region within the unit cell region UC by an ion implantation method.

In the floating diffusion formation region of the unit cell range UC, a dopant layer 60 to form the floating diffusion node 6 is also formed in the semiconductor substrate 150 by an ion implantation method, using an additional patterned mask. In addition, the dopant layers (not shown) are formed for the source/drain of transistors within the pixel array 120, such as the amplifier transistor.

P-type dopant layer forming the surface shield layer 19 is formed in the N-type dopant layer 10 by ion implantation.

During the period when ion implantation is conducted to form the photodiode 1 and floating diffusion 6 node in the pixel array 120, the peripheral circuit region 125 is covered by the resist film (not shown).

As shown in FIG. 2, in the region (N-type or P-type well region) 159 of the peripheral circuit region 125 where the transistor 7 is formed, the P-type or N-type dopant layers 73 as the source and the drain of the transistor 7 are formed in the semiconductor substrate 150, by the ion implantation using the gate electrode 72 as the mask. Furthermore, the transistor 7 may be formed in the process of forming the transistors in the pixel array 120.

As shown in FIG. 6, on the front surface of the semiconductor substrate 150 above which the gate electrodes of the transistors 2 are formed, a multilayer wiring structure that includes the interlaminar insulating films 92 and the wirings 80 is formed by a multilayer wiring technology. The interlaminar insulating films 92 cover the front surface side of the semiconductor substrate 150, for example, covering the gate electrodes 21 of the transistors 2.

In the process of forming each wiring level of the multilayer wiring structure, as shown in FIG. 2, a single interlaminar insulating film 92 of a silicon oxide film is laminated using CVD method. At each wiring level, after the process of flattening the exposed interlaminar insulating layer 92 by a CMP method, the contact plugs CP1 or via plugs 81 are embedded in the contact holes that are formed in the interlaminar insulating film 92 by photolithographic and the RIE methods as are well known in the art, the resulting interconnecting wiring layer shown schematically in FIG. 2.

A conductive layer that includes, for example, aluminum or copper as the main component is formed on the interlaminar insulating film 92 and in the contact plugs CP1 and the via plugs 81 by a sputtering method. The deposited conductive layer is patterned into a specified form by a photolithography method and a RIE method to be selectively connected to the plugs CP1 and 81. By this process, the conductive layer 80 as the wirings is formed. Simultaneously to the formation of the conductive layer 80 as the wirings, a shading film and a dummy layer that are made of the same materials are formed on the interlaminar insulating film 92. The wiring 80 may be formed by a damascene method.

As a result of these processes, the electric elements 1, 2, and 7 of the semiconductor substrate 150 are connected by the multilayer wiring technology and the circuits of the image sensor are formed.

As shown in FIG. 6, after the flattening process is conducted on the uppermost layer of the interlaminar insulating films 92 (and the conductive layer), an adhesion layer (not shown) is formed on the flattened surface of the uppermost layer of the interlaminar insulating film 92. Then, the supporting substrate 119 is pasted on the adhesion layer. By the adhesive layer, the supporting substrate 119 connects with the interlaminar insulating films 92, which cover the surface of the semiconductor substrate 150.

Before the supporting substrate 119 is adhered to the interlaminar insulating film 92, additional wirings to rewire the wirings 80 that are already formed may be formed on the uppermost layer of the interlaminar insulating film 92 by a rewiring technology, so that the additional wirings connect to the wiring formed in the interlaminar insulating films 92.

As shown in FIG. 7, after the supporting substrate 119 is adhered to the interlaminar insulating film 92, the back surface of the semiconductor substrate 150 is thinned using methods such as a CMP method and a wet etching using an HF solution. Due to this process, the thickness of the semiconductor substrate 150 is thinned to the depth of the STI 90 features.

After the thickness of the semiconductor substrate 150 is reduced, a P-type dopant layer as the back surface side shield layer 18 is formed at the back surface of the semiconductor substrate 150 within the pixel array 120 by using the ion implantation.

Next, the shrouds 32 and the inner lenses 31 are formed on the back surface of the semiconductor substrate 150. As shown in FIG. 7, a layer 32Z to form the shrouds 32 is deposited on the back surface side of the semiconductor substrate 150.

For example, SiGe is used to form the layer 32Z to form the shrouds therefrom. The SiGe layer 32Z is formed by a CVD method or as a selectively deposited epitaxial layer. The SiGe layer 32Z may be formed by implanting germanium ions into the exposed silicon of the substrate on the back surface of the semiconductor substrate 150 within the STI features, i.e., within the areas of the silicon substrate isolated by the STI 90 structures. Furthermore, the SiGe layer 32Z may be a pure semiconductor layer or an N-type/P-type semiconductor layer. Thus, the SiGe layer 32Z may include dopants.

As shown in FIG. 8, the SiGe layer 32Z is processed by the photolithography method and the RIE method to form openings that penetrate to the layer 18 on the back surface of the semiconductor substrate 150. This results in openings in the layer 32Z, into which the lenses 31 will be formed, and the remaining portions of the layer 32Z, adjacent to the opening s, form the shrouds 32.

A lens material (for example, $SiO_2$) is deposited over the SiGe layer 32 into the openings therein. An etching process (or CMP) is performed on the lens material and inner lenses 31 are thus formed within the openings.

If the lens material is overetched, the exposed surface (the side where the color filter will be placed) of the inner lenses 31 will be set back to the side of the semiconductor substrate 150 from the upper surface of the SiGe layer 32Z. In this case, the film thickness of inner lenses 31 will be thinner than the film thickness of the shrouds 32 formed from the SiGe layer 32Z Though the SiGe layer 32Z is formed before the inner lenses are formed in the above-mentioned process, the lenses may be formed first and patterned to leave gaps therein for placement of the shrouds 32, and then the SiGe layer 32Z maybe formed thereover and in the apertures, and removed from the location thereover, to form the shrouds 32.

As shown in FIG. 5, a protective insulating layer 95 is formed on the inner lens 31 and the shroud 32.

Then, the color filter 118 that has a specified dye film arrangement pattern is formed on the insulating film 95 so that each dye film is formed above and in registration with each pixel in the perpendicular direction to the principal surface of the semiconductor substrate. In the F1, F2, F3 arrangement pattern of the dye films within the color filter 118, each of the films F1, F2, F3 adjacent to one another are different in terms of the wavelength of light (color) that may pass therethrough.

The micro lens array 117 is formed on the color filter 118 in the position that overlaps with the pixel array 120.

One dye film and one micro lens ML are formed above the back surface of the semiconductor substrate 150 so as to correspond to one unit cell UC (one photo diode 1) in the pixel array 120.

Before the color filter 118 is formed, wiring, for example a metallic film is deposited on the insulating film 95 by a sputtering method. The deposited metallic film is patterned to a predetermined shape by the photolithographic and RIE methods. The thus patterned metallic film constitutes the wires in the back surface side of the semiconductor substrate 150.

Furthermore, the SiGe layer 32Z for forming the shrouds 32 may include impurities deriving from the inner lenses 31, the insulating film 95 or the wiring (metal).

After the color filter 118 and the micro lens 117 are formed, the substrate is etched to form a through via 88A through the semiconductor substrate 150, as shown in FIG. 2. The via 88A may also be formed before the color filter 118 and the micro lens 117 are formed.

Through the above-mentioned processes, the backside-illumination image sensor is manufactured.

In the manufacturing method of the image sensor of this embodiment, the inner lenses 31 and the shrouds 32 are formed on the back surface of the semiconductor substrate 150, which is the light receiving surface of the light. In this embodiment, a single shroud 32 is formed between each adjacent inner lens 31, using materials that have the property of absorbing light.

For example, it is desired that SiGe is preferably used for the shroud 32, because SiGe has a high affinity for Si, which is the primary material for the semiconductor substrate 150 and the other layers, during the manufacturing process. SiGe has a larger absorption coefficient than Si and absorbs light more efficiently than Si.

In cases where the light that transmitted through the corresponding dye film of a unit cell (pixel) is travelling in a direction toward a different unit cell, the shroud 32 that is placed around a single unit cell UC shroud absorbs the light OL1 that is travelling in the direction from the inside of the unit cell UC to the other unit cells UCs. Due to the absorption of the light by the shrouds 32, the light that otherwise would head to the other unit cells UCs is blocked at the shrouds 32 and therefore the light does not leak to adjacent unit cells and thus to the photoelectric convertors of the other unit cells UCs.

Due to this effect, the optical crosstalk in the image sensor is decreased and the colors of the images captured by the image sensor is more accurate.

Second Embodiment

A solid-state image sensor of the second embodiment will be explained referring to FIG. 9. Furthermore, in this embodiment, the explanations that is virtually identical to the explanation for the structure of the first embodiment will be explained, if preferable.

Figure 9:
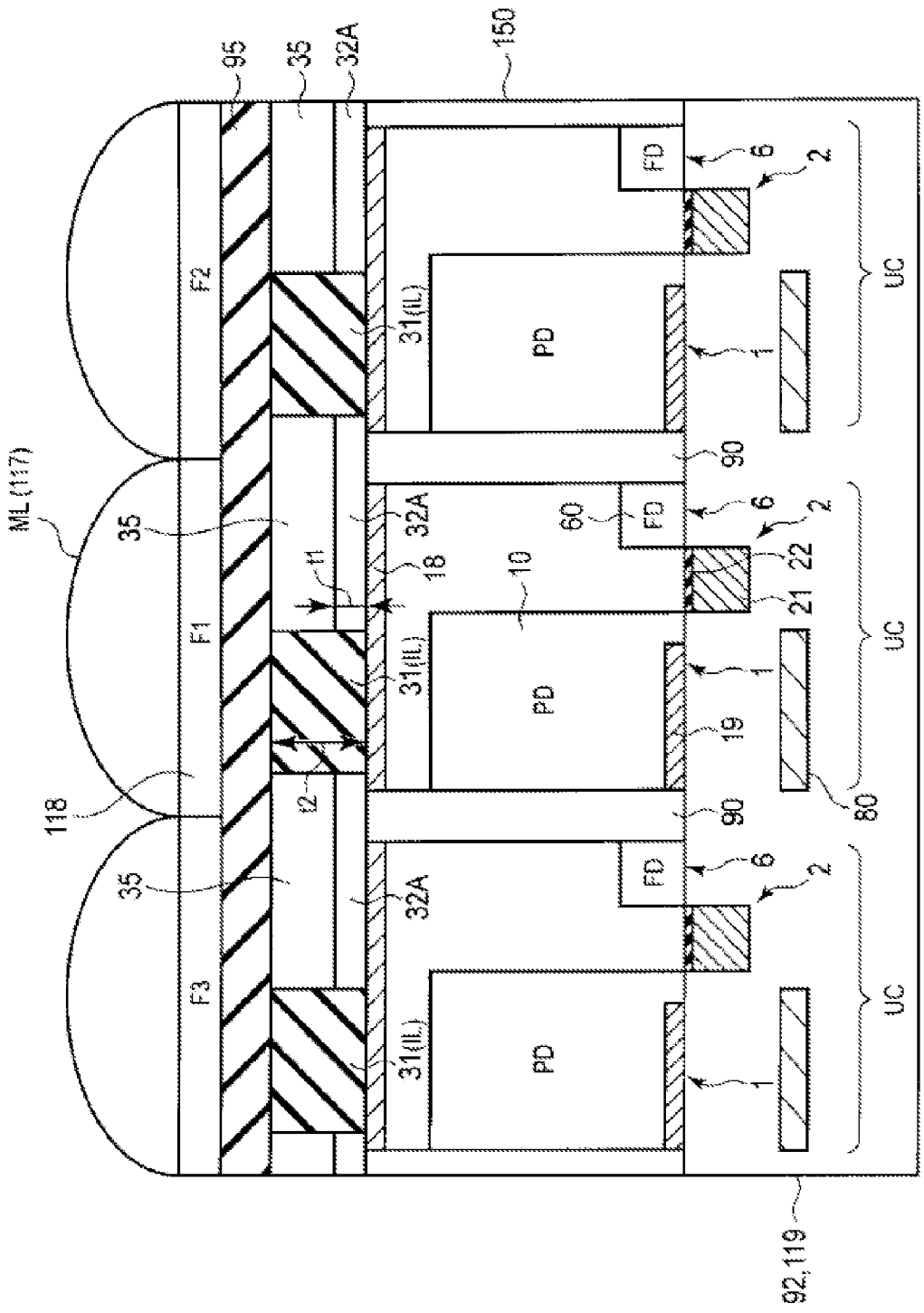
FIG. 9 is a cross-sectional diagram showing an example of a structure of a solid-state image sensor according to a second embodiment.

FIG. 9 is a cross-sectional view that schematically shows a cross sectional structure of the image sensor of this embodiment. Furthermore, in the FIG. 9, similar to FIG. 5, the illustration of the interlaminar insulating layer, the wirings, and the supporting substrate at the front surface of the semiconductor substrate is simplified.

In the second embodiment, the film thickness t1 of a shroud (e.g., a SiGe layer) 32A is thinner than the film thickness t2 of the inner lens 31.

Spacer layers 35 are placed on the shrouds 32A. For example, the spacer layers 35 are formed from transparent materials. The refractive indices of the inner lens 31 and the space layer 35 are preferred to be different.

For example, the upper surfaces of the inner lens 31 and the spacer layer 35 are formed co-planar, as shown in FIG. 9. However, there may be a difference in level between the upper surfaces of the inner lens 31 and the spacer layer 35.

The largest incident angle of the light that enters a unit cell UC from another unit cell is determined by the design of the components that are formed at the back surface of the semiconductor substrate 150, such as the micro lens 117, the color filter 118, and the insulating layer 95. Thus, the thickness t1 of the shroud 32A can be thinned within a range of design parameters of the image sensor and a range in which the shroud 32 can absorb the light from the adjacent cells.

In this embodiment, the size of the photodiode 1 at the color filter side (light receiving surface side) may be widened and the light that enters the photodiode 1 from the micro lens and the dye film that correspond to the photodiode 1 can be increased.

As a result, due to the increase in the light that enters the photodiode 1, the quality of the image captured (sensitivity of the image sensor) can improve.

Instead of adding the new spacer layer 35, a transparent insulating layer 95 as a protective film or an adhesion layer may be placed on the shroud 32A of film thickness t1, and the insulating layer 95 may be embedded in the space between the adjacent inner lenses 31. In addition, a material with no transparency such as metals may be used for the spacer layer 35 in order to improve the light blocking effect between the adjacent unit cells.

Furthermore, the manufacturing method of the image sensor in the second embodiment is virtually the same as the manufacturing method in the first embodiment, except an additional process of forming the spacer layers 35.

For example, as a manufacturing method, the shrouds 32 with a film thickness t1 and the spacer layers 35 are formed on the semiconductor substrate 150, and then the portion of the layer from which the shrouds 32 and the spacer layers 35 are formed is removed in the position corresponding to the position of the photodiodes 1. Then, the inner lenses 31 are formed on the exposed semiconductor substrate 150 that corresponds to the position of the photodiodes 1.

In addition, as a different method from the above-mentioned manufacturing method in the manufacturing processes shown in FIG. 8, the spacers 32 and overlying film layer 35 may be formed after the inner lenses 31 are formed. If so, after forming the inner lens 31 and the shrouds 32, selective etching is performed on the layers forming the shrouds 32 so that the film thickness t1 of the SiGe layer 32A will be thinner than the film thickness t2 of the inner lens 31. Then, the spacer layer 35 is formed on the shrouds 32 with a film thickness t1 between the adjacent inner lenses 31.

As stated above, the image sensor in the second embodiment is similar to the image sensor in the first embodiment and may improve the quality of the images captured by the image sensor.

Third Embodiment

A solid-state image sensor of the third embodiment will be explained referring to FIG. 10 and FIG. 11. Furthermore; in this embodiment, the explanations that is virtually identical to that of the first or the second embodiment will be explained, if preferable.

Figure 10:
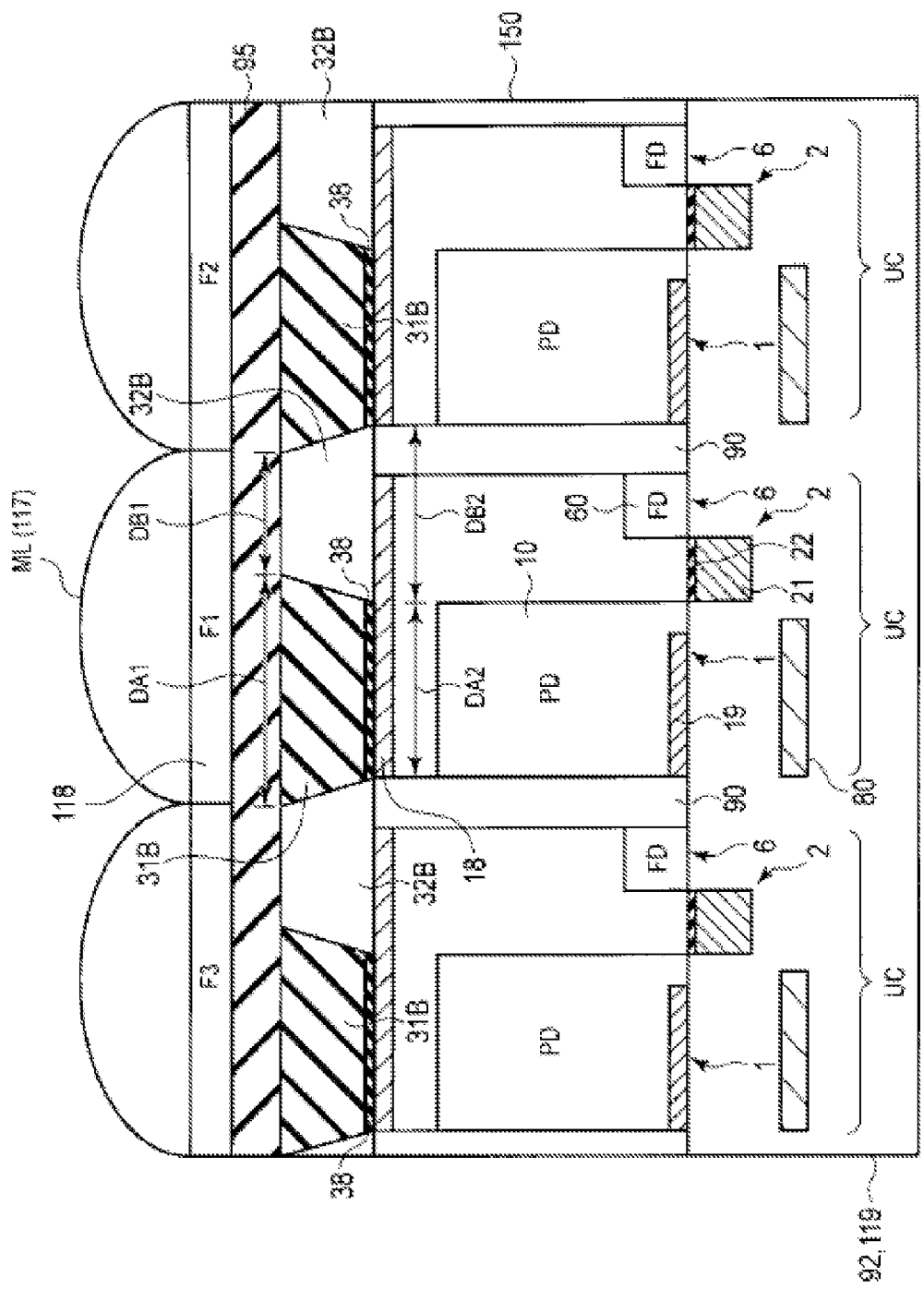
FIG. 10 is a cross-sectional diagram showing an example of a structure of a solid-state image sensor according to a third embodiment.

FIG. 10 is a cross-sectional view that schematically shows a cross sectional structure of the image sensor of this embodiment. Furthermore, in the FIG. 10, similar to FIG. 5 and FIG. 9, the illustration of the interlaminar insulating layer, the wirings, and the supporting substrate at the front surface of the semiconductor substrate is simplified.

In this embodiment, the cross-sectional shape of a shroud (for example, SiGe layer) 32B has a tapered shape and a lateral surface of the shroud 32B is sloped. Further, the dimension DB1 at the upper side of the shroud 32B is smaller than the dimension DB2 at the lower side, as shown in FIG. 10.

Corresponding to the cross-sectional shape of the shroud 32B, the cross-sectional shape of the inner lens 31A has a tapered shape. The dimension DA1 at the upper side of the inner lens 31A is larger than the dimension DA2 at the lower side of the inner lens 31A, as shown in FIG. 10.

Because the dimension DB1 is smaller than the dimension DB2, the dimension DA1 of the inner lens 31A may be enlarged to be larger than the underlying area of the photodiode 1, thus allowing a greater amount of light to pass therethrough. Therefore, the quality of the images captured can improve.

Furthermore, as stated above in the example as shown in FIG. 9, in the configuration in which the film thickness of the shroud 32 is thinner than the film thickness of the inner lens 31, the shroud may have the tapered shape. In addition, the film thickness of the tapered inner lens 31B may be thinner than the tapered shroud 32B.

Furthermore, to improve the light blocking effect, the dimension of the shroud 32B on the upper side may be larger than the dimension of the shroud 32B on the lower side.

If a tapered shroud 32B is formed as shown in FIG. 10, a film 38 may be formed between inner lens 31A and semiconductor substrate 150, depending on the manufacturing process.

Figure 11:
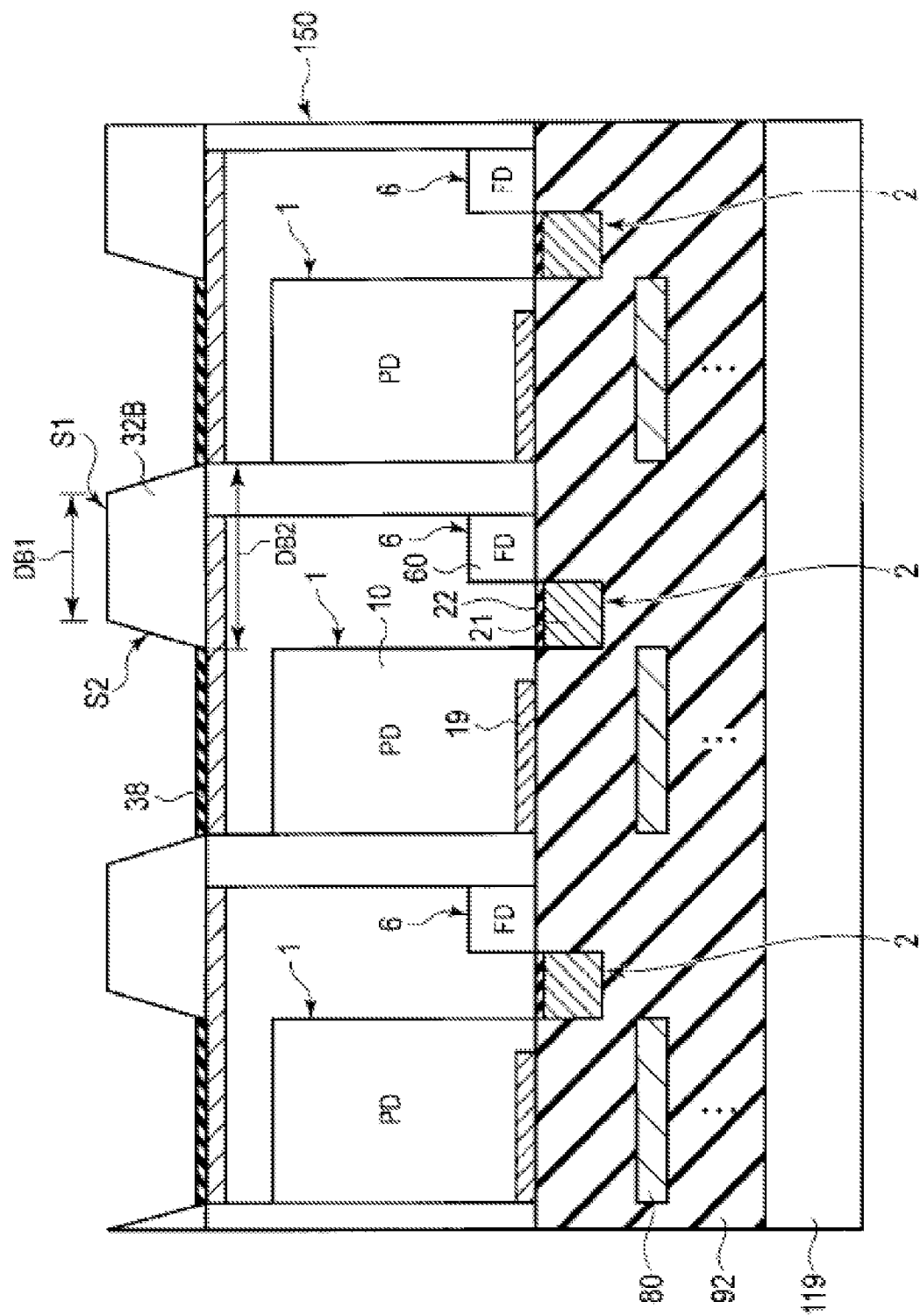
FIG. 11 shows a process of a manufacturing method of the solid-state image sensor according to the third embodiment.

The manufacturing method of the solid-state image sensor in the third embodiment is explained using FIG. 11. Furthermore, the explanations of common manufacturing process as the first embodiment will be explained, if preferable.

If the shroud formed from SiGe is formed by a selective epitaxial growth method, as shown in FIG. 11, the film (e.g., $SiO_2$) 38 is formed entirely on the back surface of the semiconductor substrate 150 to control the nuclear growth of SiGe. Then, the back surface of the semiconductor substrate (Si) is exposed within the formation region of the shroud 32B by removing the formed film 38, and the film 38 remains in the inner lens formation region.

Due to the selective epitaxial growth, single crystal SiGe selectively grows on the exposed semiconductor substrate 150 and the grown crystal constitutes the shroud 32. On the film 38, the SiGe film cannot nucleate, and therefore the crystal of SiGe is not formed on the film 38.

If the shroud 32B formed from SiGe is formed by an epitaxial growing on the grid plane of Si (100) of the Si substrate used for the semiconductor substrate 150, the crystal of SiGe grows in substantial conformity with the crystal grid of Si. A surface S1 the SiGe layer 32B that is parallel to the principal surface of the semiconductor substrate 150 constitutes an SiGe (100) surface and the lateral surface S2 of SiGe layer 32B constitutes an SiGe (111) surface. Crystal growth of SiGe progresses from the side of the semiconductor substrate 150. Due to this, a surface sloping to the top surface of SiGe layer 32B and the base surface S1 is inherently formed on the lateral surface of the SiGe layer 32B.

As a result, a shroud 32B with a tapered shape can be formed without any additional process besides the forming process of the shroud 32B. Thus, in the SiGe layer 32B as a shroud, the dimension DB1 (opposite side of the semiconductor substrate) is smaller than the dimension DB2.

If the inner lens is formed after SiGe layer 32B is formed by the selective epitaxial growth, then the inner lens is formed to conform to the tapered shape of the shroud 32B. Thus, as shown in FIG. 10, the dimension DA1 at the upper side of the inner lens 31B becomes larger than the dimension DB2 at the lower side of the inner lens 31B.

Furthermore, after the taper-shaped shroud 32B is formed, the film 38 may be removed.

By using the selective epitaxial growth and forming the taper-shaped shroud, like the above-mentioned manufacturing method, an image sensor that improves the quality of image can be obtained without complicating making the manufacturing process.

The tapered shroud may be formed using a different manufacturing procedure from the method shown in FIG. 11. Thus, the tapered shroud may be formed by not using selective epitaxial growth and rather using an etching process such as wet etching and other isotropic etching and etching from the diagonal directions to process the SiGe layer. If the SiGe layer is formed without using the selective epitaxial growth, the film (for instance, $SiO_2$ film) 38 may be formed between the shroud 32 and the semiconductor substrate 150, as the stopper for the etching process.

Accordingly, the solid-state image sensor in the third embodiment, as with the first embodiment and the second embodiment can improve the quality of the captured image by the image sensor.

(4) Modification Example

Modified application examples of the solid-state image sensor according to the above-mentioned embodiments will be explained with reference to FIG. 12 through FIG. 14. Furthermore, within these modified examples, the explanation of configurations that is virtually same as that for the first through third embodiments will be explained, if preferable. In addition, in FIG. 12 and FIG. 13, the illustration of the interlaminar insulating layer formed on the surface of the semiconductor substrate, the wirings, and the supporting substrate are simplified.

Figure 12:
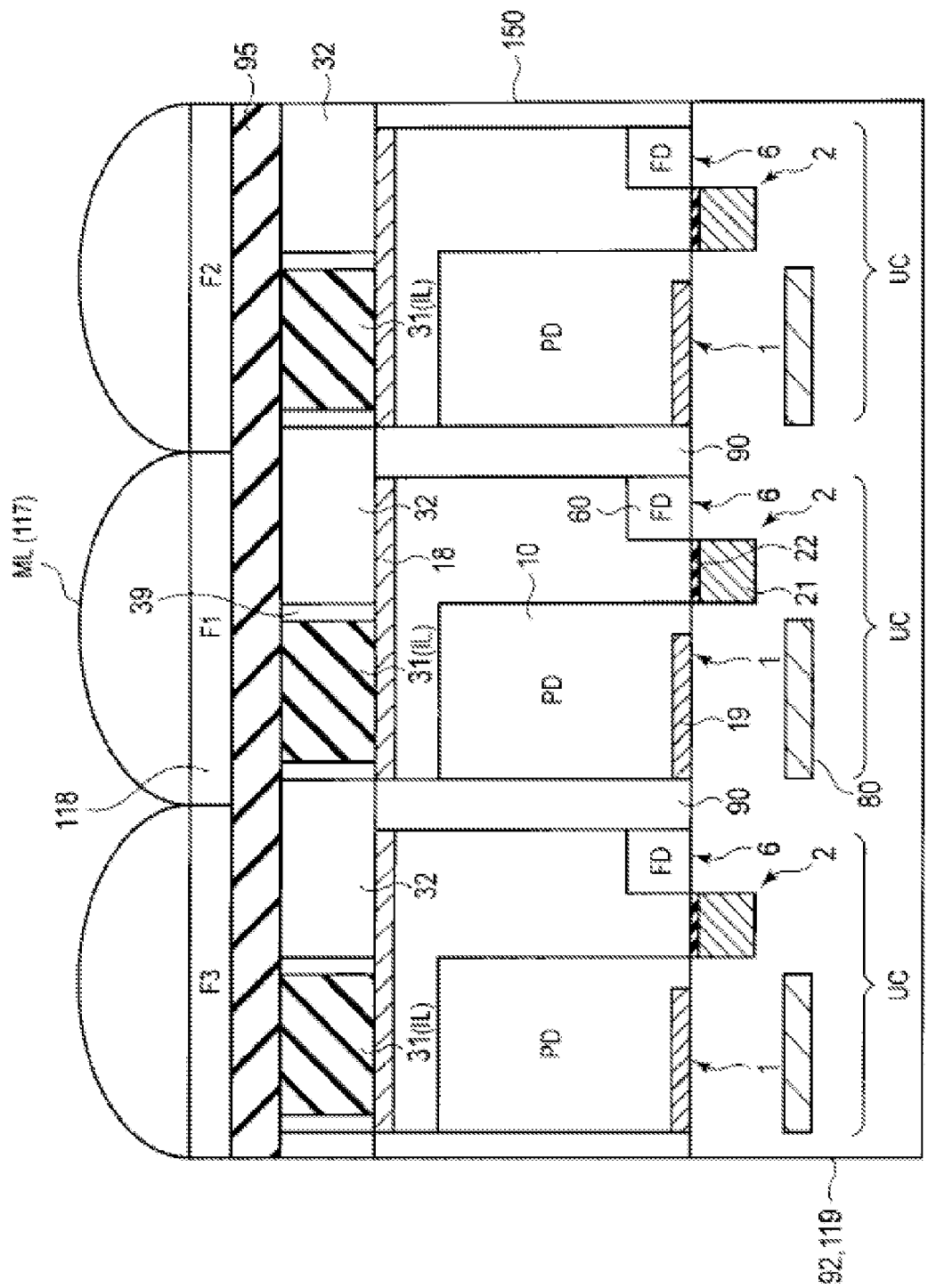
FIG. 12 explains a modification example of one of the embodiments.

FIG. 12 shows a modified example of the image sensor of the embodiments. As shown in FIG. 12, on an interface of the inner lens 31 and the shroud (e.g., SiGe layer) 32, a plurality of layers 39 made of a different composition from the inner lens material and SiGe (referred to as an interlayer below) may be placed.

For example, an interlayer 39 is a material or a compound that is composed of at least one of the constituent element of the shroud 32 (for here, Si and Ge). Specifically, the interlayer 39 is composed of a composition, such as SiGe oxide, SiGe nitride, SiGe oxynitride, Si, Si oxide, Si nitride, Si oxynitride, Ge, Ge oxide, Ge nitride, and Ge oxynitride.

The interlayer 39 may be a material or a compound that includes at least one of the constituent elements of the inner lens 31. In addition, the interlayer 39 may be a compound that includes at least one constituent element of the shroud 32 and at least one constituent element of inner lens 31. For example, a metal film or an organic membrane may be used as the interlayer 39.

If the interlayer 39 is formed between the inner lens 31 and the SiGe layer 32, a material that can reflect light at the interface between the inner lens 31 and the interlayer 39 or the interface between the interlayer 39 and the shroud 32 can be selected for the material of the interlayer 39.

If the interlayer 39 is formed from transparent materials, it is preferable that the refractive indices of the inner lens 31 and the interlayer 39 differs so that light within the lens 31 incident on the interface reflects at the interfaces of each layer 31, 32, 39.

The amount of light received by the photodiode 1 increases, because the interface of the inner lens 31 and the interlayer 39 reflects the incident light and the inner lens 31 constitutes a waveguide from the micro lens ML to the photodiode 1. Moreover, because the interface between the interlayer 39 and the SiGe layer 32 reflects the incident light and the reflective light at the photodiode 1, the leakage of light from one unit cell (pixel) UC to another unit cell adjacently positioned decreases. As a result, the optical crosstalk of the image sensor decreases. Therefore, the quality of the captured images can improve.

Although the example that the interlayer 39 is formed on the lateral surface of the shroud 32 is shown in FIG. 12, the interlayer 39 may be placed on the upper surface (the color filter side) of the shroud 32. Additionally, in order for the shroud to be divided for each unit cell (pixel), an insulator that surrounds the shroud (and the inner lens) may be placed on the back surface of semiconductor substrate 150 and at the element isolation area.

Figure 13:
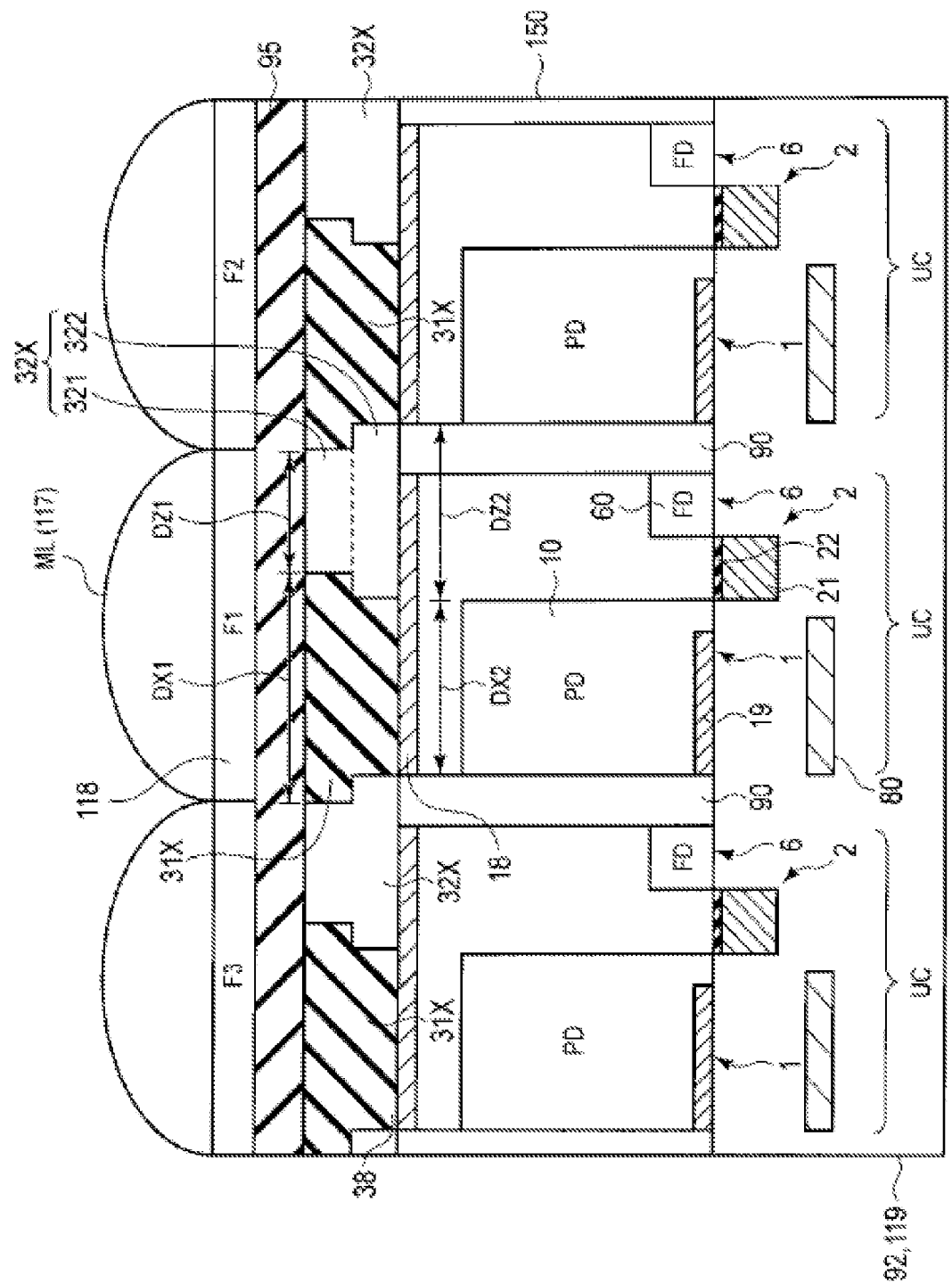
FIG. 13 explains another modification example of one of the embodiments.

FIG. 13 shows another modified example of the image sensor, which is different from the example shown in FIG. 12.

In the second embodiment as shown in FIG. 10, the taper-shaped shroud 32 shroud makes the opening area of the photodiode 1 on the light receiving surface side wider.

As shown in FIG. 13, the cross-sectional shape of the shroud 32X, which is composed of SiGe, shroud is processed into a step-wise form by photo lithographic and etching processes. Due to this process, a shroud 32X is formed so that the dimension DZ1 at the upper side is smaller than the dimension DZ2 at the lower side, as shown in FIG. 13.

The shroud 32X shroud contains a first section 321 that has the dimension DZ1 and a second section 322 that has the dimension DZ2, which is larger than DZ1. The two sections 321 and 322 have a rectangular (square shaped) cross-sectional shape, respectively.

The second section 322 is formed on the back surface of the semiconductor substrate 150. The first section 321 is formed on the second section 322, and formed between the second section 322 that has the dimension DZ2 and the insulating layer 95 in the perpendicular direction to the principal surface of the semiconductor substrate 150.

Corresponding to the shape of the shroud 32 X, the dimension DX1 at the upper side of the inner lens 31Z becomes larger than the dimension DX2 at the lower side of the inner lens 31Z, as shown in FIG. 13.

In the modified example shown in FIG. 13, like the example shown in FIG. 10, the opening space of photodiode 1 can be expanded at the light receiving surface, and the incident light received by the photodiode 1 can increase.

Figure 14:
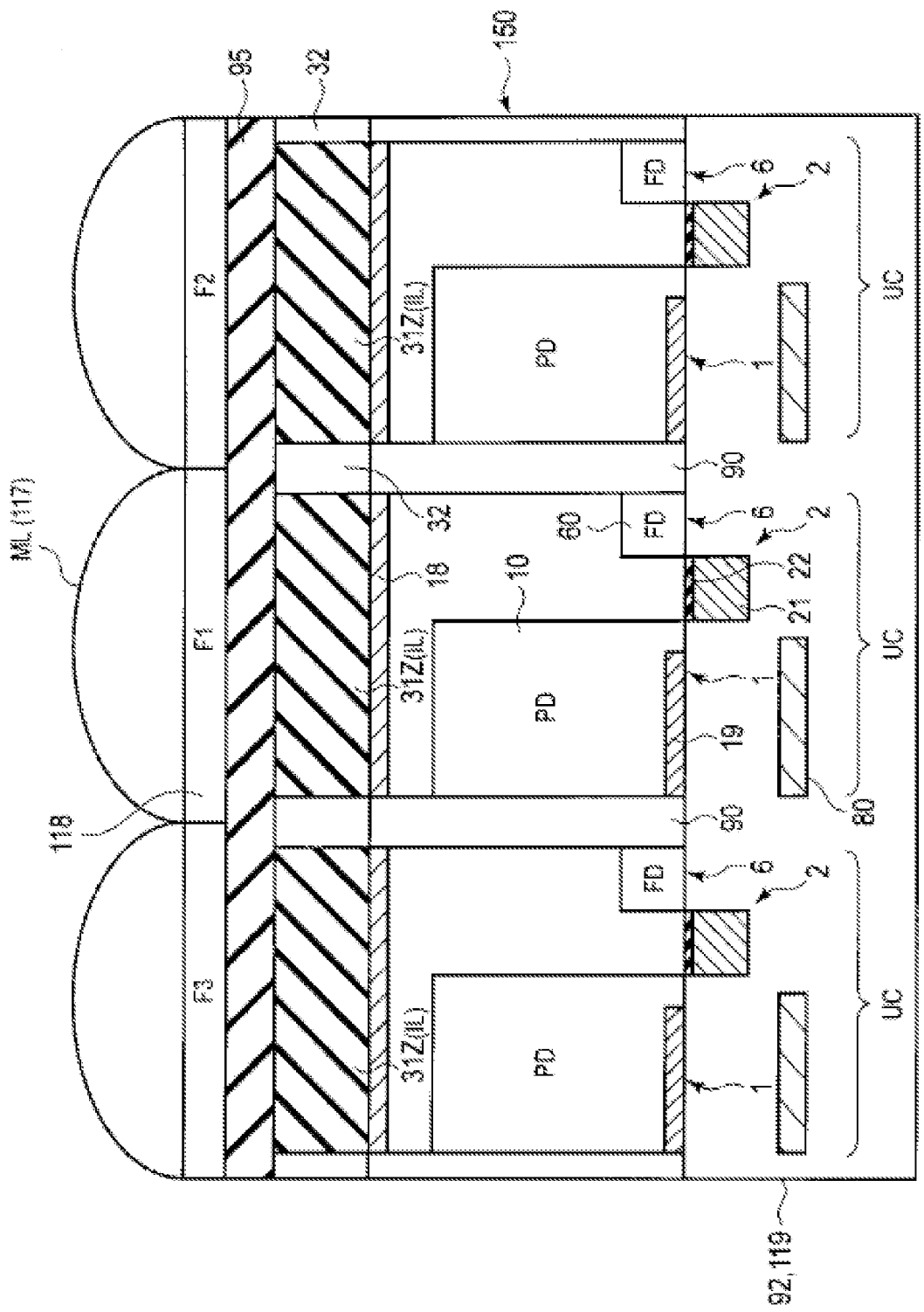
FIG. 14 explains another modification example of one of the embodiments.

FIG. 14 shows another modified example of the image sensor, which is different from FIG. 12 and FIG. 13. The first through the third embodiments have shown examples in which the shroud 32 shroud partially covers the unit cell region, so that it covers the formation region of the transfer gate and the formation region of the floating diffusion. However, as shown in FIG. 14, if the shroud 32 shroud is placed at the boundary part between the adjacent unit cells UCs, the shroud 32 may be placed within the element isolation area, and the inner lens 31 may extend over the unit cell region UC.

The shroud 32 is formed parallel to the layout of element isolation layer 90. Each inner lens 31 covers the entire unit cell region UC at the back surface of the semiconductor substrate 150.

Due to this configuration, the opening space of the photodiode 1 at the back surface of the semiconductor substrate 150 can be widened and the amount of light that is received by the photodiode 1 from the micro lens ML can increase.

Therefore, the modified examples shown in FIG. 12 through FIG. 14 can achieve virtually the same effect as the first through third embodiments can.

(5) Application Example

An application example of the solid-state image sensor of the embodiments will be explained with reference to FIG. 15.

The solid-state image sensor (image sensor) in the embodiment is modularized and applied to digital cameras and cellular phones with cameras.

Figure 15:
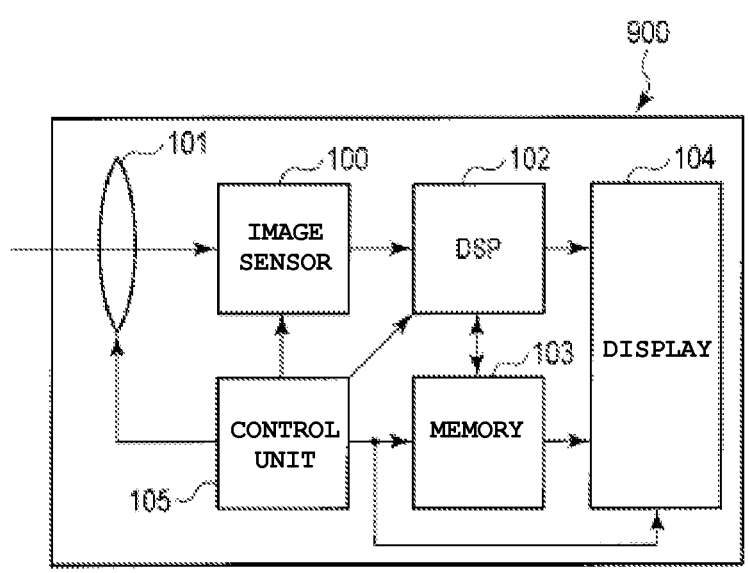
FIG. 15 shows an example of an application of the solid state imaging sensor according to one of the embodiments.

FIG. 15 is a block diagram that shows an application example of the image sensor of the embodiments.

A camera (or a cellular phone with a camera) 900, which includes the image sensor 100 according to one of the embodiments, includes an optical lens unit (lens unit) 101, a signal processing unit (e.g., DSP: Digital Signal Processor) 102, a memory unit (memory) 103, a display screen (display) 104, and a control unit (controller) 105 in addition to the image sensor 100.

The image sensor 100 receives (captures) the light from an object and converts it to electrical signals.

The lens unit 101 concentrates the light from the object to the image sensor 100 and forms the image that corresponds to the light from the imaged object on the image sensor 100. The lens Unit 101 includes a plurality of lenses and is able to mechanically or electrically control optical properties (e.g., focal length).

The DSP 102 processes the signals that are output from the image sensor 100. The DSP 102 forms the image data that correspond to the imaged object based on the signals output from the image sensor 100.

The memory 103 stores the image data output from the DSP 102. The memory 103 also may store signals and data provided from the outside. The memory 103 can be a memory chip, such as a DRAM and a flash memory that is installed within the camera 900, or a memory card or an USB memory that may be attached or removed from the body of camera 900.

The display 104 shows the image data output from the DSP 102 and the memory 103. The data output from the DSP 101 or memory 103 is an image data or a video data.

The controller 105 controls the action of each component 100-104 within the camera 900.

As mentioned above, the image sensor 100 of the embodiment can be applied to a camera or a cellular phone with a camera. The camera 900 including the image sensor 100 of one of the present embodiments improves the quality of the captured image.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensor comprising:
    a semiconductor element substrate having a plurality of photo electric conversion elements;
    an interlaminar insulating film having wires, formed at a first surface of the semiconductor element substrate;
    a color filter having dye films of a plurality of colors, formed at a second surface of the semiconductor element substrate;
    a micro lens array having a plurality of micro lenses, formed above the color filter;
    a plurality of inner lenses formed between the photoelectric conversion elements and the dye films; and
    a shroud that surrounds each of the inner lenses, formed above the second surface of the semiconductor element substrate, wherein
    the shroud is comprised of SiGe, and
    the semiconductor substrate is a silicon substrate.

2. The solid-state image sensor according to claim 1, wherein a thickness of the shroud is thinner than a thickness of the inner lens.

3. The solid-state image sensor according to claim 2, further comprising:
    a spacer that is formed on the shroud so that the upper surface of the spacer is in the same level as the upper surface of the inner lens.

4. The solid-state image sensor according to claim 1, wherein
    an upper width of the shroud is narrower than a lower width of the shroud.

5. The solid-state image sensor according to claim 4, wherein a lateral side of the shroud has a tapered shape.

6. The solid-state image sensor according to claim 4, wherein the shroud has a lower part and an upper part that has a narrower width than the lower part, and
    a lateral side of the shroud has a stepwise shape.

7. The solid-state image sensor according to claim 4, wherein the semiconductor element substrate further has a plurality of semiconductor elements that control the photo electric conversion elements, and the shroud is formed between the semiconductor elements and the color filter.

8. The solid-state image sensor according to claim 1, further comprising:
    a plurality of interlayers that are formed between each of the inner lenses and the shroud.

9. The solid state image sensor of claim 1, further including:
    a lens unit configured to direct light passing therethrough onto the image sensor;
    a processor configured to process signals that are output from the image sensor and output image data;
    a memory configured to store the image data output from the processor;
    a display configured to display an image corresponding to the image data output from the processor and the memory; and
    a controller configured to control the image sensor, the lens unit, the processor, the memory, and the display.

10. A manufacturing method of a solid state image sensor comprising:
    forming a semiconductor element substrate having a plurality of photo electric conversion elements;
    forming an interlaminar insulating film having wires, at a first surface of the semiconductor element substrate;
    forming a color filter having dye films of a plurality of colors, at a second surface of the semiconductor element substrate;
    forming a micro lens array having a plurality of micro lenses, above the color filter;
    forming a plurality of inner lenses between the photoelectric conversion elements and the dye films; and
    forming a shroud that surrounds each of the inner lenses, above the second surface of the semiconductor element substrate, wherein
    the shroud is comprised of SiGe, and
    the semiconductor substrate is a silicon substrate.

11. The manufacturing method according to claim 10, wherein
    a thickness of the shroud is formed thinner than a thickness of the inner lens.

12. The manufacturing method according to claim 10, wherein
    an upper width of the shroud is formed to be narrower than a lower width of the shroud.

13. The manufacturing method according to claim 12, wherein the shroud is formed by a selective epitaxial growth method.

14. The manufacturing method according to claim 13, further comprising:
    forming a layer configured to prevent a growth of a crystal that constitutes the shroud, on regions on which the inner lenses are to be formed.

15. A solid-state image sensor comprising:
    a semiconductor element substrate having a plurality of photo electric conversion elements;
    an interlaminar insulating film having wires, formed at a first surface of the semiconductor element substrate;

a color filter having dye films of a plurality of colors, formed at a second surface of the semiconductor element substrate;
a micro lens array having a plurality of micro lenses, formed above the color filter;
a plurality of inner lenses formed between the photoelectric conversion elements and the dye films; and
a shroud that prevents a light that passes through the dye film corresponding to one of the photo electric conversion elements from entering onto another one of the photo electric conversion elements, formed above the second surface of the semiconductor element substrate,
the shroud is comprised of SiGe, and
the semiconductor substrate is a silicon substrate.

16. The solid-state image sensor according to claim 15, wherein a thickness of the shroud is thinner than a thickness of the inner lens.

17. The solid-state image sensor according to claim 15, further comprising:
a spacer that is formed on the shroud so that the upper surface of the spacer is in the same level as the upper surface of the inner lens.

18. The solid-state image sensor according to claim 15, wherein
an upper width of the shroud is narrower than a lower width of the shroud.

* * * * *